(12) United States Patent
Lin et al.

(10) Patent No.: US 10,553,275 B2
(45) Date of Patent: Feb. 4, 2020

(54) DEVICE HAVING WRITE ASSIST CIRCUIT INCLUDING MEMORY-ADAPTED TRANSISTORS AND METHOD FOR MAKING THE SAME

(71) Applicant: TAIWAN SEMICONDUCTOR MANUFACTURING COMPANY, LTD., Hsinchu (TW)

(72) Inventors: Yangsyu Lin, New Taipei (TW); Chiting Cheng, Taichung (TW); Jonathan Tsung-Yung Chang, Hsinchu (TW); Shang-Chi Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/949,774

(22) Filed: Apr. 10, 2018

(65) Prior Publication Data

US 2018/0301185 A1  Oct. 18, 2018

Related U.S. Application Data

(60) Provisional application No. 62/486,945, filed on Apr. 18, 2017.

(51) Int. Cl.
  *G11C 11/00* (2006.01)
  *G11C 11/419* (2006.01)
  (Continued)

(52) U.S. Cl.
  CPC .............. *G11C 11/419* (2013.01); *G03F 1/20* (2013.01); *G03F 1/26* (2013.01); *G03F 1/30* (2013.01);
  (Continued)

(58) Field of Classification Search
  CPC .................................................... G11C 11/412
  (Continued)

(56) References Cited

U.S. PATENT DOCUMENTS 7,260,442 B2   8/2007  Hwang et al.
7,633,110 B2  12/2009  Chi et al.
(Continued)

FOREIGN PATENT DOCUMENTS

JP  2009277341    11/2009
KR  20130111264   10/2013

OTHER PUBLICATIONS

Przybylski, Steven A., "Cache and Memory Hierarchy Design: A Performance-directed Approach", Morgan Kaufmann, 1990, Computers; pp. 375-376; books.google.com; Aug. 22, 2017.
(Continued)

*Primary Examiner* — Hoai V Ho
(74) *Attorney, Agent, or Firm* — Hauptman Ham, LLP

(57) ABSTRACT

A write assist circuit includes: a memory-adapted latch and memory-adapted third and fourth NMOS transistors. The latch includes: a memory-adapted first PMOS transistor and a memory-adapted first NMOS transistor connected in series between a power-supply voltage and a first node, the first node being selectively connectable to a ground voltage; and a memory-adapted second PMOS transistor and a memory-adapted second NMOS transistor connected in series between the power-supply voltage and the second node, the second node being selectively connectable to the ground voltage. The third NMOS transistor is connected in series between the first node and the ground voltage; and the fourth NMOS transistor connected in series between the second node and the ground voltage. A gate electrode of each of the
(Continued)

third and fourth transistors is connected to a latch-enable signal-line thereby for controlling the memory-adapted latch.

20 Claims, 18 Drawing Sheets

(51) Int. Cl.
    *G06F 17/50*         (2006.01)
    *H01L 27/11*         (2006.01)
    *G03F 1/32*          (2012.01)
    *G03F 1/20*          (2012.01)
    *G03F 1/26*          (2012.01)
    *G03F 1/30*          (2012.01)
    *G03F 1/36*          (2012.01)

(52) U.S. Cl.
    CPC .................. *G03F 1/32* (2013.01); *G03F 1/36* (2013.01); *G06F 17/5072* (2013.01); *H01L 27/1104* (2013.01); *H01L 27/1116* (2013.01)

(58) Field of Classification Search
    USPC ......................................................... 365/154
    See application file for complete search history.

(56) References Cited

U.S. PATENT DOCUMENTS

| | | | |
|---|---|---|---|
| 7,852,661 B2 | 12/2010 | Liu | |
| 7,898,875 B2 | 3/2011 | Tao et al. | |
| 8,305,831 B2 | 11/2012 | Lee et al. | |
| 8,482,990 B2 | 7/2013 | Cheng et al. | |
| 9,256,709 B2 | 2/2016 | Yu et al. | |
| 9,305,623 B2 | 4/2016 | Katoch | |
| 9,324,413 B2 | 4/2016 | Ko et al. | |
| 2009/0285010 A1* | 11/2009 | Tao ..................... | G11C 11/413 365/154 |
| 2013/0258759 A1 | 10/2013 | Liaw | |
| 2014/0040838 A1 | 2/2014 | Liu et al. | |
| 2015/0278429 A1 | 10/2015 | Chang | |

OTHER PUBLICATIONS

Chen, Wai-Kai, "The VLSI Handbook, Second Edition", CRC Press, Apr. 19, 2016, Technology & Engineering; 53.2.2-53.4; books.google.com; Aug. 22, 2017.

Office Action dated Jun. 20, 2019 from corresponding application No. KR 10-2018-0044389.

\* cited by examiner

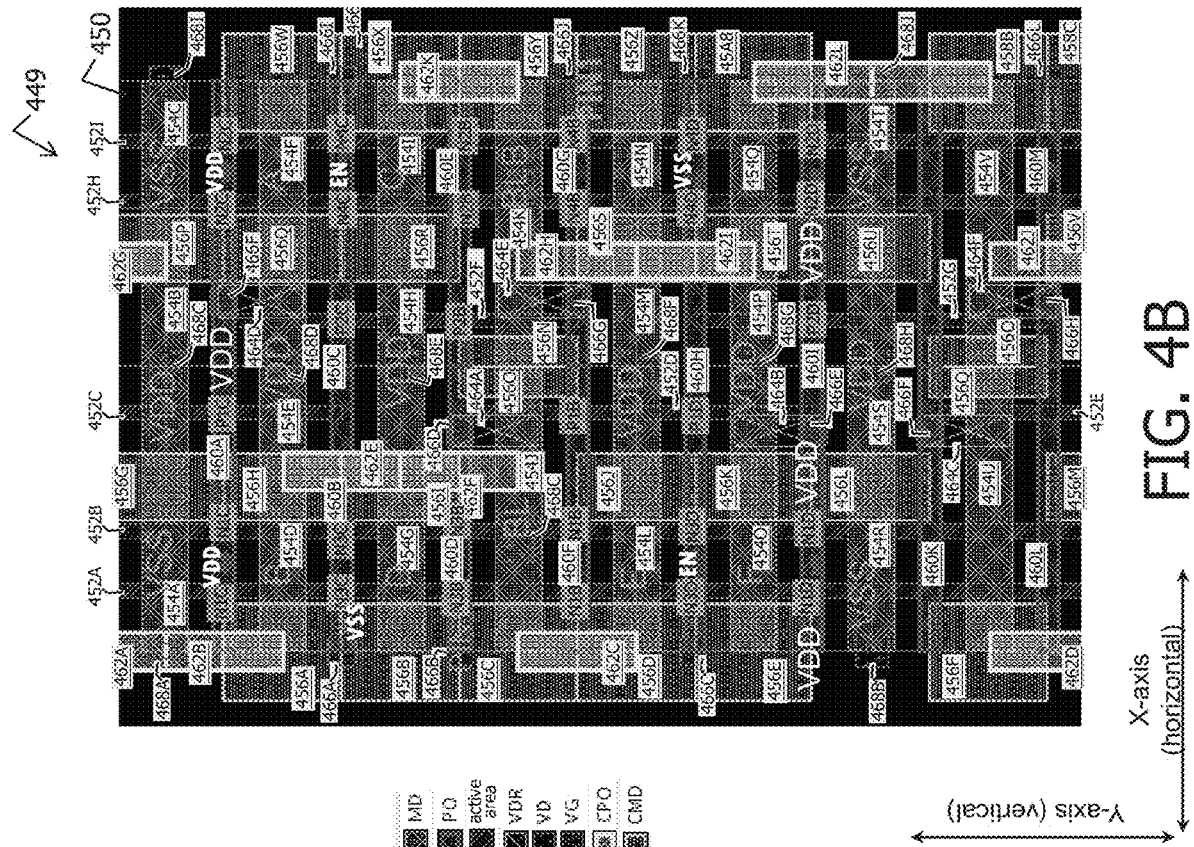
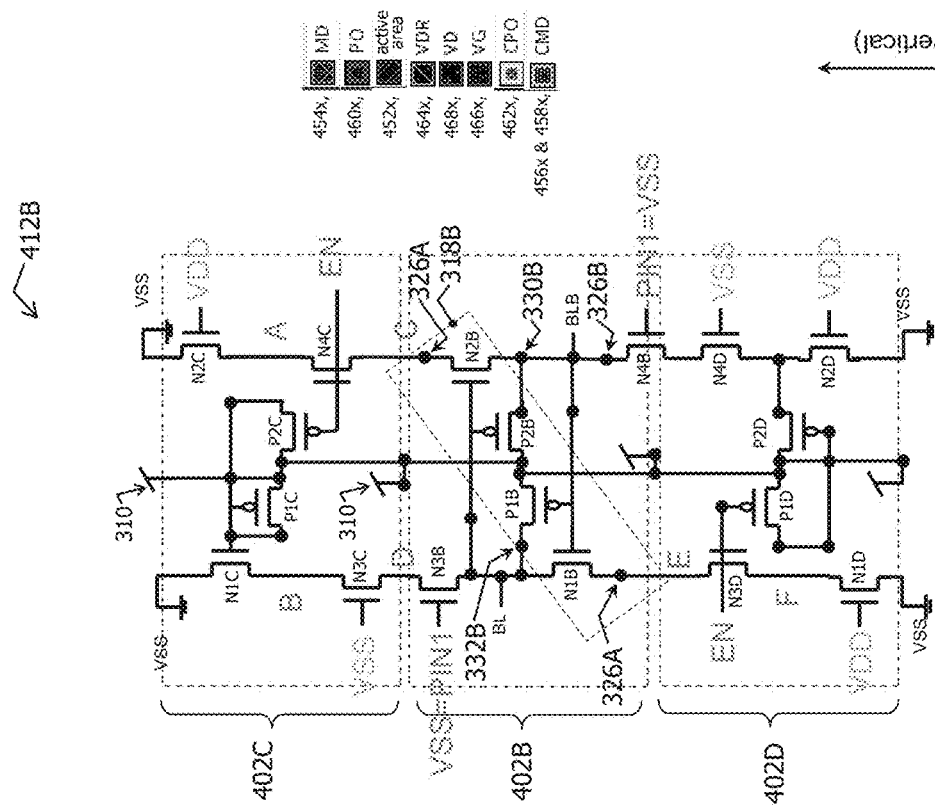
FIG. 4B
FIG. 4A

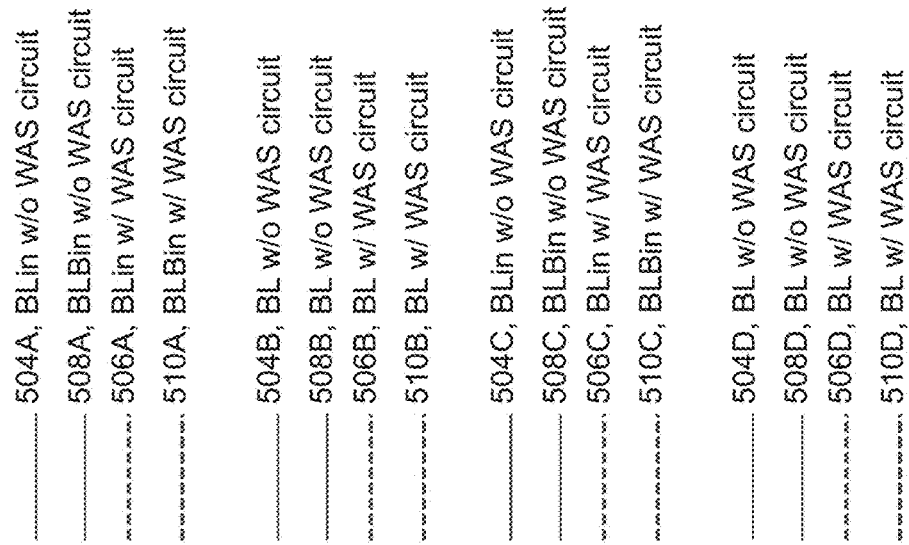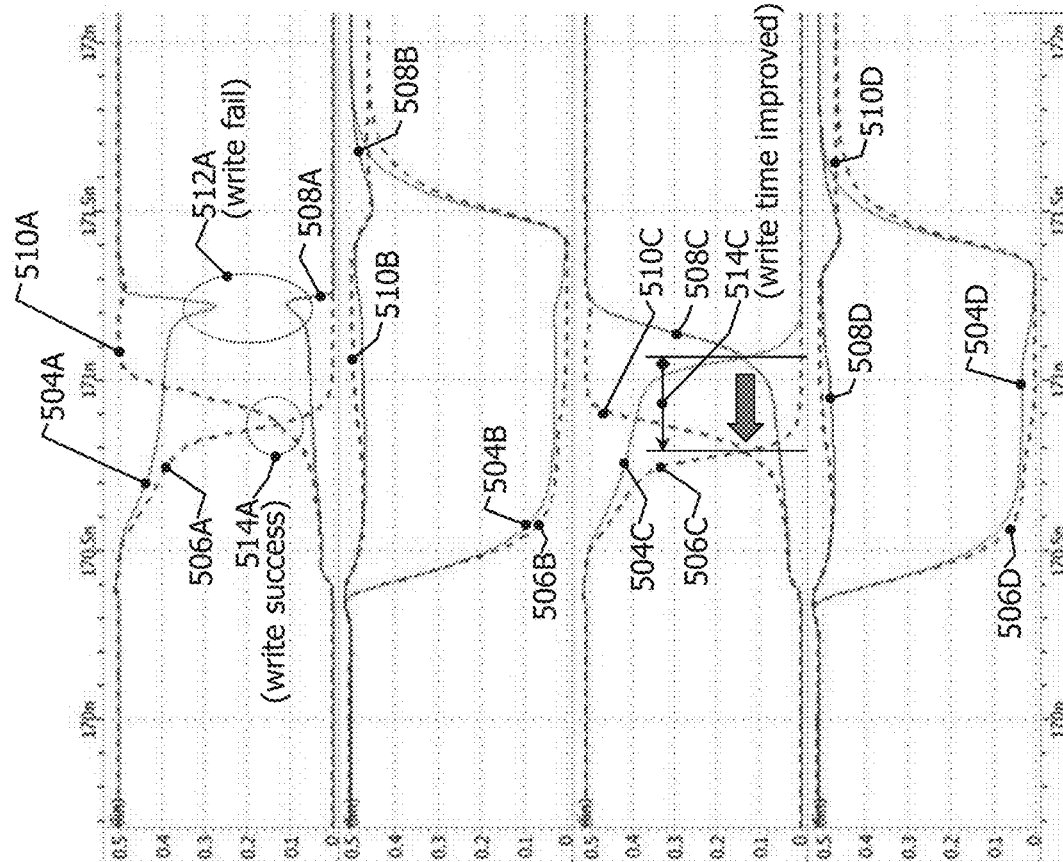
FIG. 5A
FIG. 5B
FIG. 5C
FIG. 5D

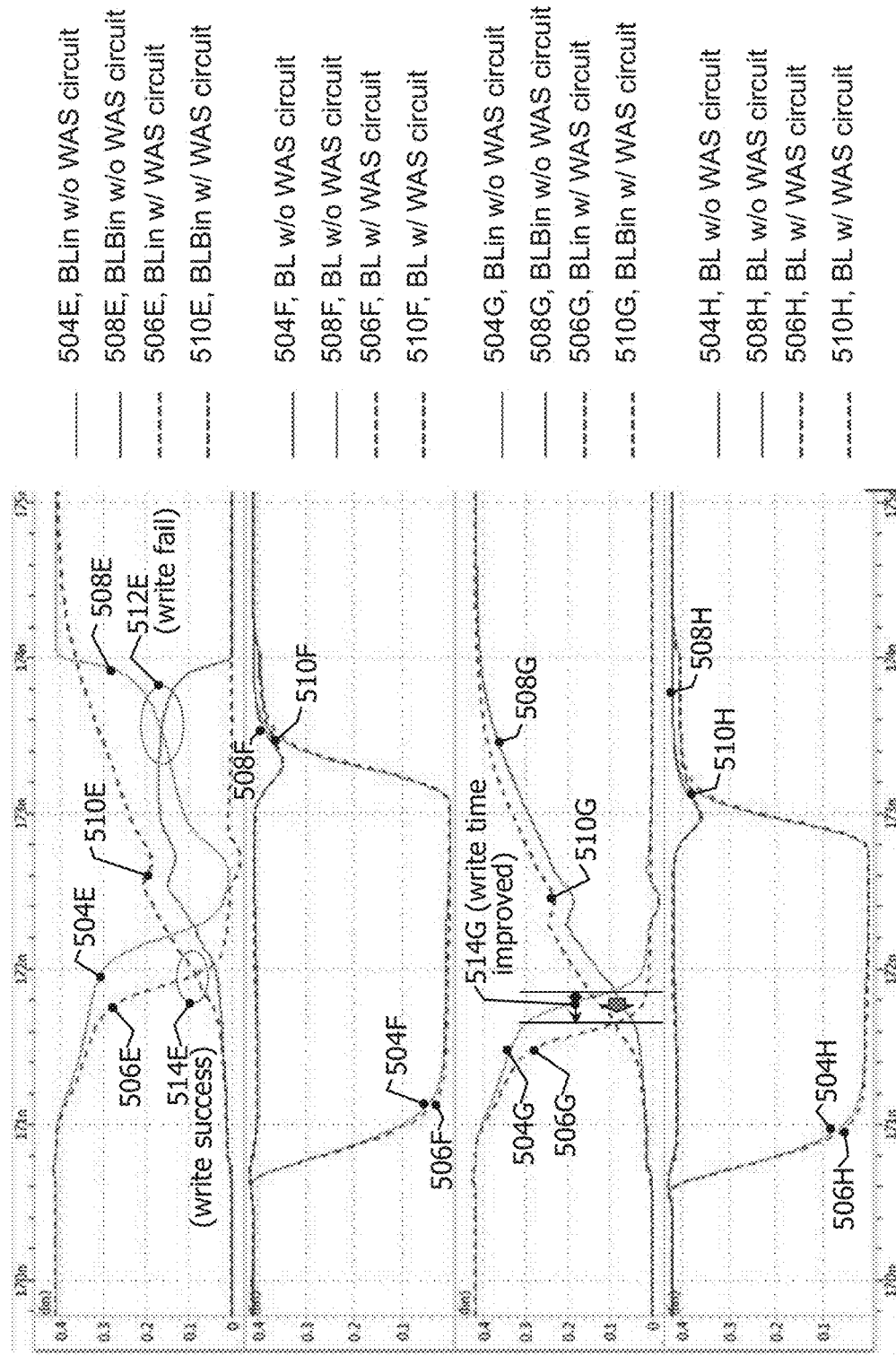

(Write Behavior of Bitcell)

DEVICE HAVING WRITE ASSIST CIRCUIT INCLUDING MEMORY-ADAPTED TRANSISTORS AND METHOD FOR MAKING THE SAME

BACKGROUND

In a typical memory system, memory cells are arranged in an array. Each memory cell (also referred to as a cell) stores a datum representing one bit. Each cell is located at the intersection of a row and a column. Accordingly, a particular cell is accessed by selection of the row and the column which intersect at the particular cell. Each of the cells in a column is connected to a bit line. An input/output (I/O) circuit uses the bit line to read a datum from, or write a datum to, a selected one of the bit cells in the column.

Typically, there are many cells in a column. Due to varying physical distances between the I/O circuit and the cells, the bit line represents a different resistive and/or capacitive load for each of the cells in the column.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 4A is a circuit diagram of another WAS circuit, in accordance with at least one embodiment of the present disclosure.

FIG. 4B is a layout diagram of the WAS circuit of FIG. 4A, in accordance with at least one embodiment of the present disclosure.

FIGS. 5A-5H are waveforms showing an improved write-margin performance using a WAS circuit wherein the WAS circuit is in accordance with at least one embodiment of the present disclosure.

DETAILED DESCRIPTION

Figure 1:
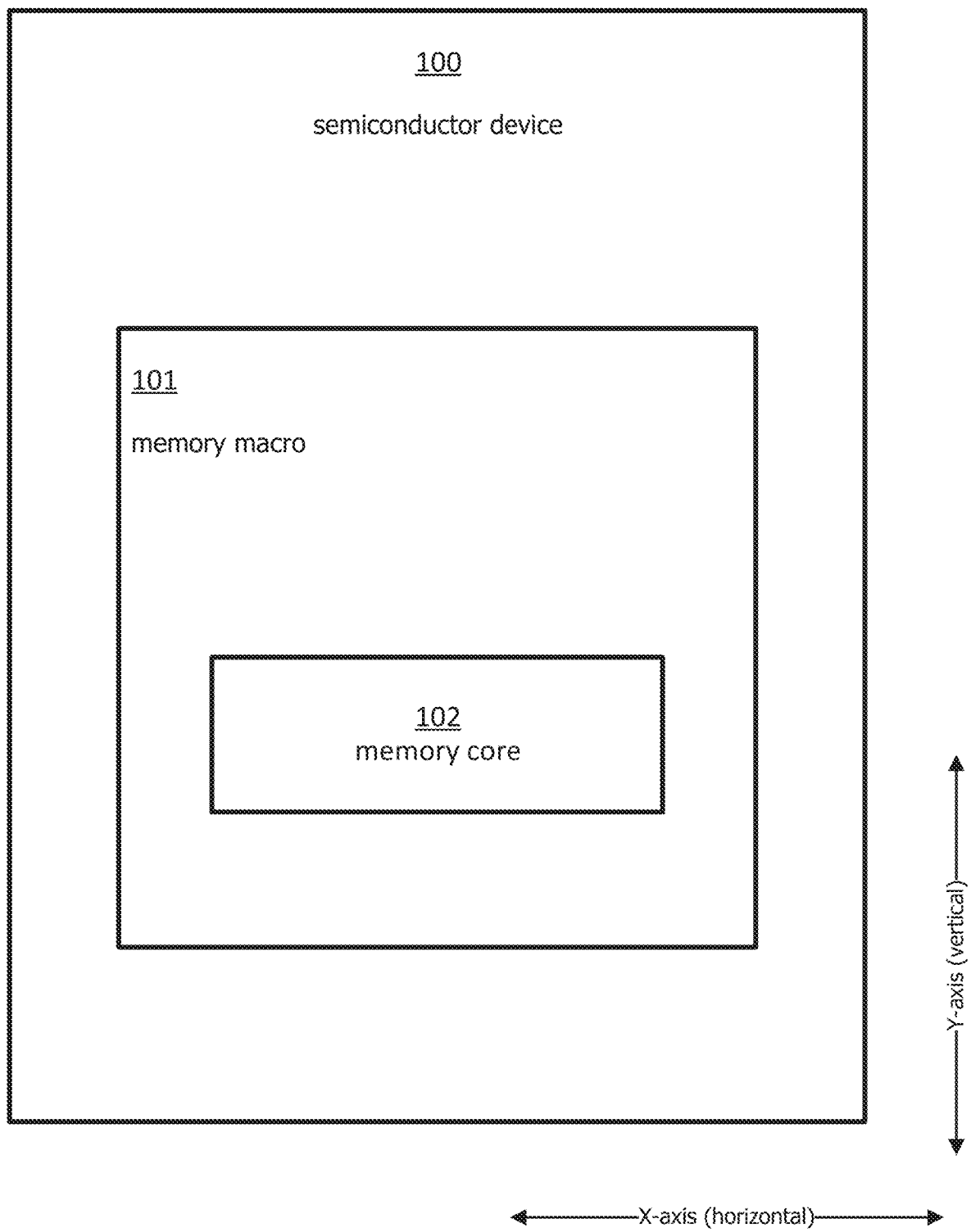
FIG. 1 is a block diagram of a semiconductor device, in accordance with at least one embodiment of the present disclosure.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The phrases "substantially rectangular," "substantially parallel," "substantially perpendicular," and "substantially aligned," and the like should be understood in the context of variations which result from manufacturing process-tolerances.

According to some embodiments, in a memory system having an array of memory cells (bit cells), a write assist (WAS) circuit is formed by modifying three bit cells (memory cells). In some embodiments, a WAS circuit is formed from first, second and third memory cells. In some embodiments, each of the first, second and third memory cells has an initial, standard six transistor (6T) configuration. The WAS circuit includes a latch and a switch circuit for turning ON/OFF the latch. The latch of the WAS circuit is configured using four transistors found in the initial configuration of a first memory cell. In some embodiments, the switching circuit is configured using a transistor found in the second memory cell and a transistor found in the third memory cell. A benefit of the WAS circuit is that the WAS circuit mitigates a problem of resistive and/or capacitive loading of a bit line and a corresponding bit_bar line.

According to another approach, the WAS circuit is formed of transistors fabricated with a logic-adapted process. Cells in a memory are formed of transistors fabricated with a memory-adapted process. Logic-adapted processes differ from memory-adapted processes, e.g., by using different dopant implantation technologies. Details regarding WAS circuits configured with logic-adapted transistors are disclosed in U.S. Pat. No. 7,898,875, granted Mar. 1, 2011, the entirety of which is hereby incorporated by reference. Logic-adapted transistors and memory-adapted transistors differ in a number of ways. For example, memory-adapted transistors are adapted for a memory power-domain and for low leakage currents, and consequently have high threshold voltages and low saturation currents. Logic-adapted transistors are adapted for a logic power-domain and for high saturation currents, and consequently have low threshold voltages and high leakage currents. Logic-adapted transistors have a larger footprint (consume more area) than memory-adapted transistors. A size ratio between logic-adapted transistors and memory-adapted transistors is dependent on the process/technology node by which the transistors will be fabricated. In some embodiments, the ratio of the footprint (FP) of a memory-adapted transistor, $FP_{mem}$ to a logic-adapted transistor, $FP_{logic}$ is $FP_{mem}/FP_{logic} \approx 0.6$. Logic-adapted transistors consume more power than memory-adapted transistors.

According to some embodiments, in an SRAM memory system, resistive and/or capacitive loading of a bit line and a corresponding bit_bar line is improved not only by providing a write assist (WAS) circuit for an array of SRAM cells, but by forming the WAS circuit from reconfigured SRAM cells. The other approach (noted above) uses logic-adapted transistors to form the WAS circuit, which requires the use of a logic-adapted process to form logic-adapted transistors (from which the WAS circuit is composed), and a separate memory-adapted process to form the SRAM cells (which include memory-adapted transistors). An advantage of at least some embodiments is that the WAS circuit and the array of SRAM cells are formed using one process, namely a memory-adapted process, rather than two processes as in the other approach. Another advantage of at least some embodiments is that the footprint of the WAS circuit and the array of SRAM cells is smaller than in the other approach because the WAS circuit is formed of reconfigured SRAM cells (which are formed of memory-adapted transistors) rather than being formed of logic-adapted transistors as in the other approach.

FIG. 1 is a block diagram of a semiconductor device 100, in accordance with at least one embodiment of the present disclosure.

In FIG. 1, semiconductor device 100 includes, among other things, a memory macro 101. Memory macro 101 includes a memory core 102 (see item 200 of FIG. 2A, discussed below). In some embodiments, memory macro 101 is energized in part by a logic power-domain (not shown) and in part by a memory power-domain (not shown). The logic power-domain provides (among other things) voltage levels which are appropriate to logic-adapted transistors. The memory power-domain provides (among other things) voltage levels which are appropriate to memory-adapted transistors. In some embodiments, memory macro 101 is a static random access memory (SRAM) macro. In some embodiments, macro 101 is an SRAM memory system such that memory core 102 is an SRAM core, the SRAM memory system further including (among other things) addressing circuitry (not shown), timing circuitry (not shown) or the like.

In some embodiments, circuit macro/module 101 is understood in the context of an analogy to the architectural hierarchy of modular programming in which subroutines/procedures are called by a main program (or by other subroutines) to carry out a given computational function. In this context, semiconductor device 100 uses circuit macro/module 101 to perform one or more given functions. Accordingly, in this context and in terms of architectural hierarchy, semiconductor device 100 is analogous to the main program and circuit macro/module (hereinafter, macro) 101 is analogous to subroutines/procedures. In some embodiments, macro 101 is a soft macro. In some embodiments, macro 101 is a hard macro. In some embodiments, macro 101 is a soft macro which is described using register-transfer level (RTL) code. In some embodiments, synthesis, placement and routing have yet to have been performed on macro 101 such that the soft macro can be synthesized, placed and routed for a variety of process nodes. In some embodiments, macro 101 is a hard macro which is described/couched in a binary file format (e.g., Graphic Database System II (GDSII) stream format), where the binary file format represents planar geometric shapes, text labels, other information and the like of one or more layout diagrams of macro 101 in hierarchical form. In some embodiments, synthesis, placement and routing have been performed on macro 101 such that the hard macro is specific to a particular process node.

Figure 2A:
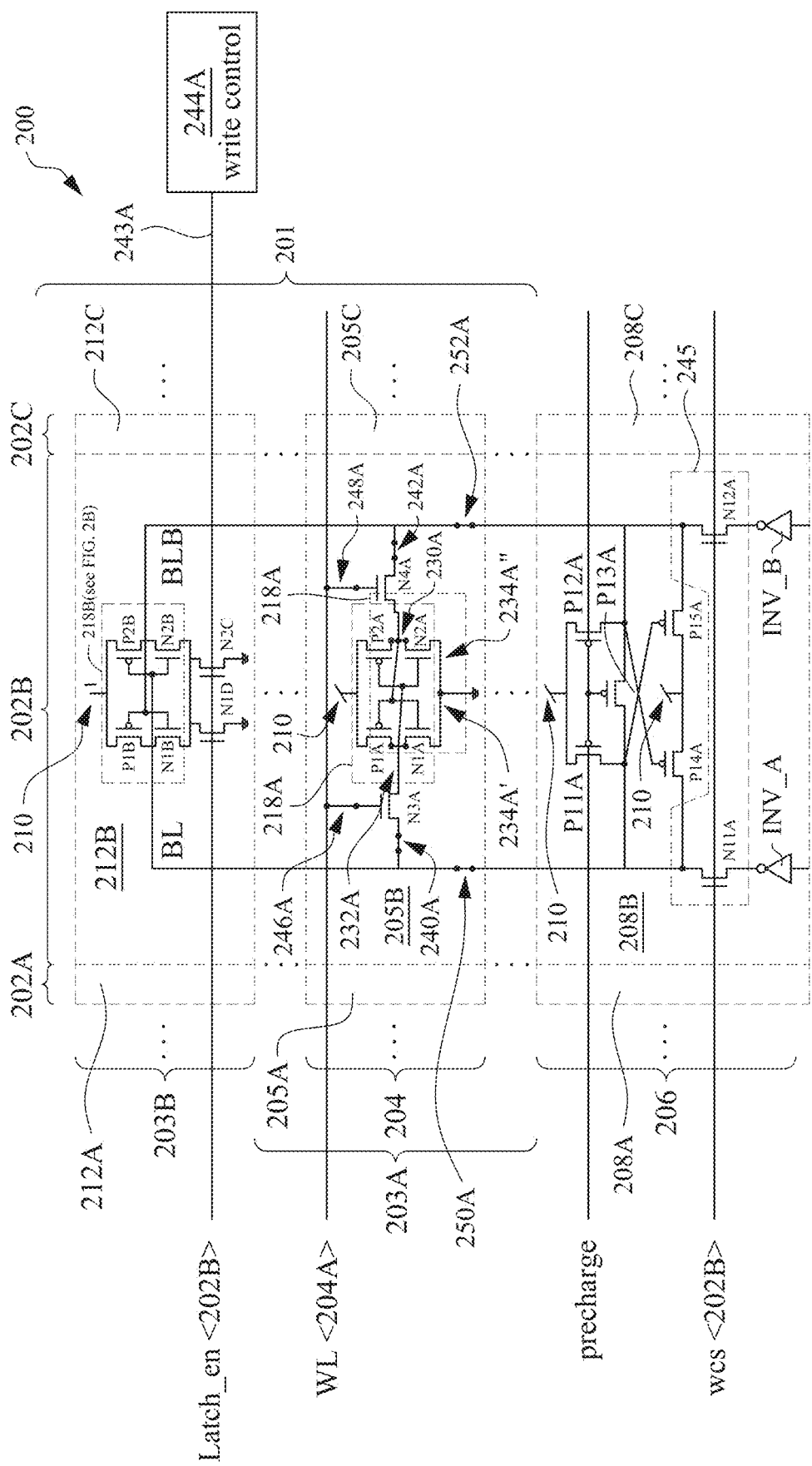
FIG. 2A is a circuit diagram of an SRAM core in accordance with at least one embodiment of the present disclosure.

FIG. 2A is a circuit diagram of a memory core 200 in accordance with at least one embodiment of the present disclosure. Memory core 200 of FIG. 2A is an example of memory core 102 of FIG. 1. In some embodiments, memory core 200 is an SRAM memory core.

SRAM core 200 includes: an array 201 of SRAM cells; an array 206 of peripheral logic (PL) units; a latch-enable signal line 243A; and a write control unit 244A to generate a latch-enable signal Latch_en<202B> for latch-enable signal line 243A. In some embodiments, SRAM array 201 is formed by a memory-adapted process and so includes memory-adapted transistors. In some embodiments, SRAM array 201 is formed by a memory-adapted process which is specific to SRAM, namely an SRAM-adapted process. In some embodiments, PL array 206 is formed by a logic-adapted process and so includes logic-adapted transistors.

SRAM array 201 and PL array 206 are organized into columns. For the sake of simplicity of illustration, three columns, namely columns 202A, 202B and 202C, are shown in FIG. 2A. As indicated by ellipses located horizontallyadjacent to each of columns 202A and 202C, additional columns are included in SRAM array 201 and PL array 206.

SRAM array 201 includes a sub-array 203A of SRAM cells and a write assist (WAS) array 203B of WAS circuits (see discussion of FIG. 2B, below). Sub-array 203A includes rows of SRAM cells. For the sake of simplicity of illustration, one row, namely row 204, is shown in FIG. 2A. As indicated by the ellipses located above and below row 204, additional rows are included in sub-array 203A.

Also for the sake of simplicity of illustration in FIG. 2A, and relative to columns 202A-202C, corresponding SRAM cells 205A, 205B and 205C are shown in row 204, corresponding WAS circuits 212A, 212B (see discussion of FIG. 2B, below) and 212C are shown in WAS array 203B, and corresponding PL units 208A, 208B and 208C are shown in PL array 206. WAS circuit 212B includes a memory-adapted latch 218B and transistors N2C and N1D (see discussion of FIG. 2B, below), such that WAS circuit 212B includes six transistors. In some embodiments, WAS circuit 212B includes 5 transistors. In some embodiments, WAS circuit 212B includes more than 6 transistors. In WAS circuit 212B, transistors N2C and N1D are controlled to function as a switching unit by which to turn ON/OFF latch 218B, and more generally turn ON/OFF WAS circuit 212B (again, see discussion of FIG. 2B, below). In some embodiments, WAS circuit 212B includes transistor N2C but not transistor N1D. In some embodiments, WAS circuit 212B includes transistor N1D but does not include transistor N2C. Cell 205A, WAS circuit 212A and PL unit 208A are included in column 202A. Cell 205B, WAS circuit 212B and PL unit 208B are included in column 202B. Cell 205C, WAS circuit 212C and PL unit 208C are included in column 202C.

In some embodiments, sub-array 203A includes N rows of SRAM cells, where N is a positive integer. In some embodiments, N=512. In some embodiments, N is a positive integer other than 512. Each row of sub-array 203A is provided with a corresponding word line. Accordingly, row 204 is provided with word line WL<204A>.

In some embodiments, SRAM cells 205A-205C and other SRAM cells (not shown) included in sub-array 203A correspond to instances/instantiations of a standard cell structure, where the standard cell structure is included in a library of various standard cell structures. In some embodiments, such a library is included in an electronic design automation (EDA) system (see discussion of FIG. 9 below).

SRAM cell 205B has a six transistor (6T) configuration which includes: memory-adapted PMOS transistors P1A and P2A; and memory-adapted NMOS transistors N1A, N2A, N3A and N4A. In some embodiments, different interconnections for the six transistors of SRAM cell 205B are contemplated. In some embodiments, configurations for SRAM cell 205B based on a number of transistors other than six are contemplated.

Transistors P1A-P2A and N1A-N2A are configured as a memory-adapted latch 218A. Transistors N3A and N4A are configured as corresponding pass-gates. Memory-adapted latch 218A is connected between a power-supply voltage 210 and a ground voltage. In some embodiments, power-supply voltage 210 is VDD for the memory power-domain. In some embodiments, the ground voltage is VSS for the memory power-domain. Memory-adapted latch 218A includes: transistors P1A and N1A connected in series as a first inverter between power-supply voltage 210 and the ground voltage; and transistors P2A and N2A connected in series as a second inverter between power-supply voltage 210 and the ground voltage. More particularly, a source electrode of transistor P1A is connected to power-supply voltage 210, a drain electrode of transistor P1A is connected to a segment 232A, segment 232A is connected to a drain electrode of transistor N1A, a source electrode of transistor N1A is connected to a segment 234A' (which is conductive), and segment 234A' is connected to the ground voltage. Segment 232A represents a storage node of latch 218A corresponding to a bit line BL. Similarly, a source electrode of transistor P2A is connected to power-supply voltage 210, a drain electrode of transistor P2A is connected to a segment 230A, segment 230A is connected to a drain of transistor N2A, a source electrode of transistor N2A is connected to segment 234A", and segment 234A" is connected to the ground voltage. Segment 230A represents a storage node of latch 218A corresponding to a bit_bar line BLB.

In SRAM cell 205B, transistor N4A is connected in series between bit_bar line BLB and a first node, where the first node corresponds to segment 230A. More particularly, a segment 242A is connected between bit_bar line BLB and a first drain/source electrode of transistor N4A, and a second drain/source electrode of transistor N4A is connected to the first node. The first node is connected to the drain electrode of transistor P2A, the drain electrode of transistor N2A, and gate electrodes of each of transistor P1A and N1A. Transistor N3A is connected in series between bit line BL and a second node, where the second node corresponds to segment 232A. More particularly, a segment 240A is connected between bit line BL and a first drain/source electrode of transistor N3A, and a second drain/source electrode of transistor N3A is connected to the second node. The second node is connected to the drain electrode of transistor P1A, the drain electrode of transistor N1A, and gate electrodes of each of transistor P2A and N2A. Gate electrodes of each of transistors N3A and N4A are connected to corresponding word line WL<204A>. More particularly, the gate electrode of transistor N3A is connected to a segment 246A, and segment 246A is connected to word line WL<204A>. The gate electrode of transistor N4A is connected to a segment 248A, and segment 248A is connected to word line WL<204A>. The portion of bit line BL overlapping SRAM cell 205B includes a segment 250A. The portion of bit_bar line BLB overlapping SRAM cell 205B includes a segment 252A.

For the sake of brevity, a discussion of the operation of SRAM cell 205B, and more generally sub-array 203A, is omitted albeit with respect to the assistance provided by WAS array. Among other things, the operation of WAS array 203B is discussed below (e.g., see discussion of FIG. 2B).

PL unit 208B includes: PMOS transistors P11A, P12A, P13A, P14A and P15A; NMOS transistors N11A and N12A; and inverters INV_A and INV_B. Source electrodes of transistors P11A and P12A are connected to power-supply voltage 210. Transistor P13A is connected between drain electrodes of transistors P11A and P12A such that the drain electrode of transistor P11A is connected to a first source/drain electrode of transistor P13A at a third node, and such that the drain electrode of transistor P12A is connected to a second source/drain electrode of transistor P13A at a fourth node. The third node is connected to bit line BL. The fourth node is connected to bit_bar line BLB. A gate electrode of each of transistors P11A, P12A and P13A is connected to a precharge signal-line. Together, transistors P11A and P12A represent a precharge circuit. Transistor P13A represents an equalizer circuit. Transistors P14A and P15A are connected in series between bit line BL and bit_bar line BLB such that a first source/drain electrode of transistor P14A is connected to bit line BL, a first source/drain electrode of transistor P15A is connected to bit_bar line BLB, and second source/ drain electrodes of transistors 14A and P15A are connected together at a fifth node. The fifth node is connected to power-supply voltage 210. Transistors P14A and P15A represent a cross-pair circuit used for a write operation Transistor N11A is connected in series between bit line BL and inverter INV_A. Transistor N12A is connected in series between bit_bar line BLB and INV_B. Inverters INV_A and INV_B receive corresponding data which is to be written into SRAM cell 205B. Inverters INV_A and INV_B represent drivers for writing the data into SRAM cell 205B. A gate electrode of each of transistors N11A and N12A is connected to a line having a write column select (WCS) signal wcs<202B> corresponding to column 202B. Column 202B is selected/deselected by using signal wcs<202B> to turn on/off corresponding transistors N11A and N12A, where transistors N11A and N12A comprise a column-selection switch 245. For the sake of brevity, further discussion of the operation of PL unit 208B, and more generally PL array 206, is omitted.

In the context of FIG. 2A, SRAM core 200 is shown in a two-dimensional context for which the horizontal direction is a first direction and the vertical direction is a second direction. Relative to the vertical direction, WAS array 203B and PL array 206 are located on opposite sides of sub-array 203A. In some embodiments, relative to the vertical direction, WAS array 203B is located substantially in the middle of sub-array 203A and thereby closer to PL array 206 in terms of the vertical direction. In some embodiments, relative to the vertical direction, there are two WAS arrays, with a first one of the WAS arrays (corresponding to WAS array 203B) being located on the side of sub-array 203A opposite to PL array 206, and with a second one of the WAS arrays (corresponding to a copy of WAS array 203B) being located in the middle of sub-array 203A. In some embodiments, relative to the vertical direction, other locations of WAS array 203B are contemplated. In some embodiments, the first and second directions are directions other than the corresponding horizontal and vertical directions, albeit with the second direction being substantially perpendicular to the first direction.

Figure 2B:
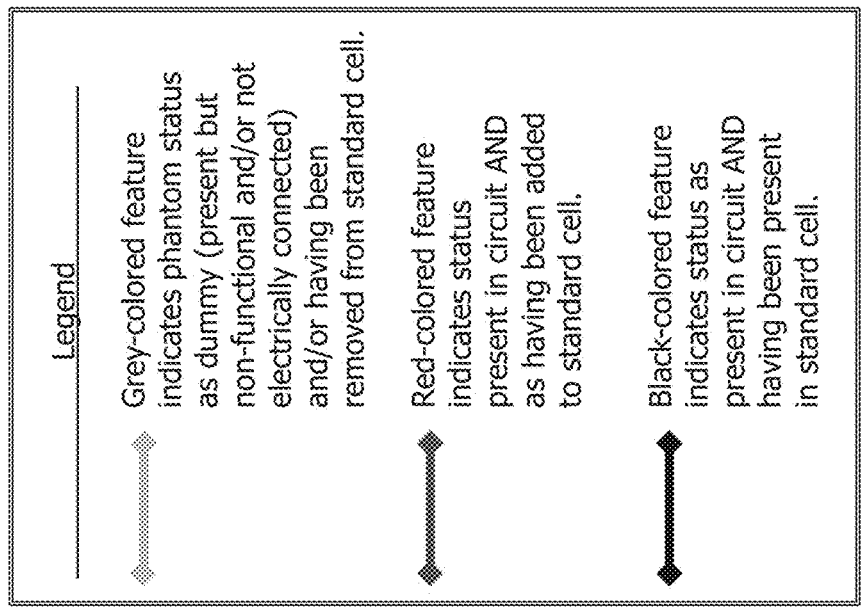
FIG. 2B is a circuit diagram of a WAS circuit, in accordance with at least one embodiment of the present disclosure.
Figure 2B:
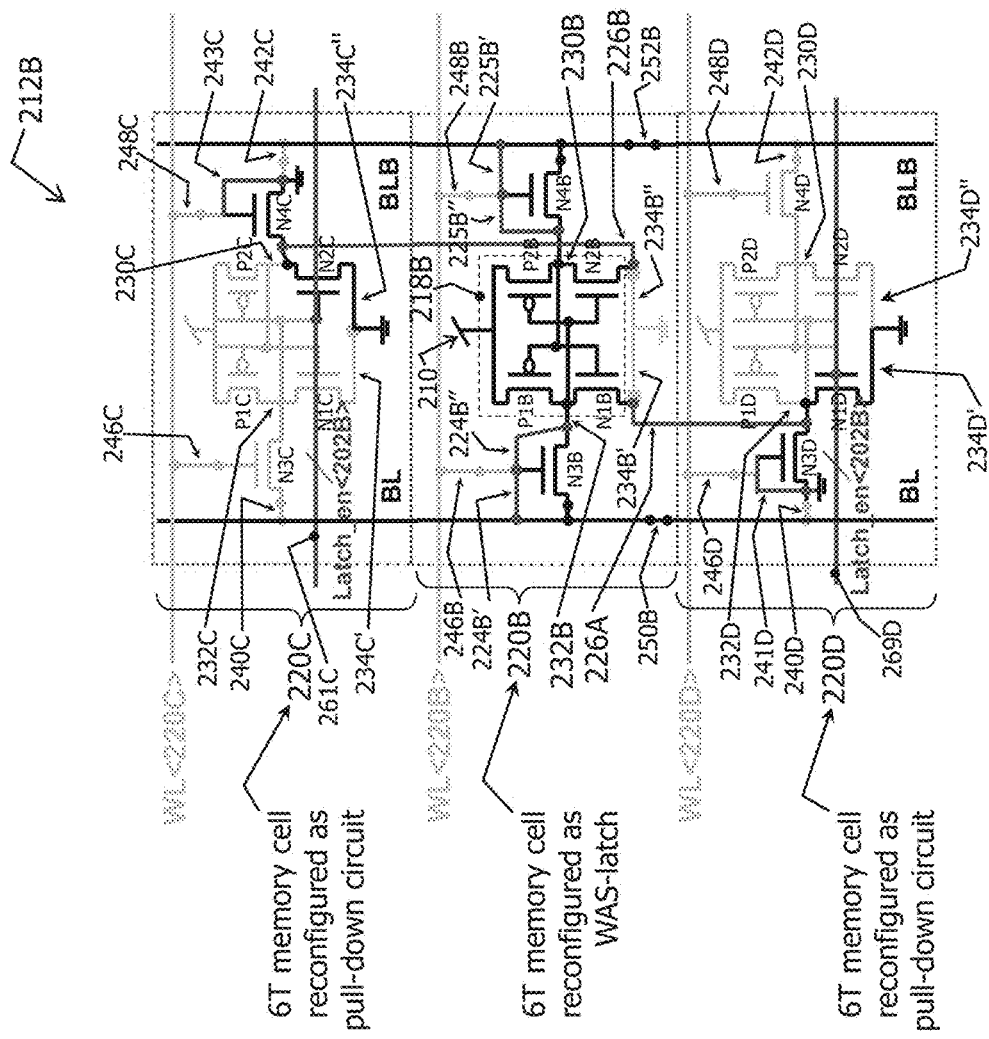

FIG. 2B is a circuit diagram of WAS circuit 212B, in accordance with at least one embodiment of the present disclosure. SRAM core 200 of FIG. 2A is an example of SRAM core 102 of FIG. 1. Relative to FIG. 2A, FIG. 2B shows WAS circuit 212B in more detail.

WAS circuit 212B includes sub-circuits 220B, 220C and 220D. It is noted that reference number 220A is not used because reference numbers 220B-220D correspond more intuitively to the transistor numbering scheme (as used herein) than do reference numbers 220A-220C.

Each of sub-circuits 220B-220D is based on a corresponding six transistor (6T) configuration. In some embodiments, different interconnections for the six transistors of corresponding sub-circuits 220B-220D are contemplated. In some embodiments, configurations for corresponding sub-circuits 205B based on a number of transistors other than six are contemplated.

In some embodiments, sub-circuits 220B-220D are corresponding reconfigured versions of SRAM cell 205B of FIG. 2A. In some embodiments, sub-circuits 220B-220D correspond to reconfigured versions of instances/instantiations of a standard cell structure, where the standard cell structure is included in a library of various standard cell structures. In some embodiments, such a library is included in an EDA system (again, see discussion of FIG. 9 below). In some embodiments, sub-circuits 220B-220D are corresponding reconfigured versions of instances of another standard SRAM cell in a library of various standard cell structures.

Sub-circuit 220B is a first reconfigured version of SRAM cell 205B, and as such sub-circuit 220B includes: memory-adapted PMOS transistors P1B and P2B; and memory-adapted NMOS transistors N1B, N2B, N3B and N4B. Sub-circuit 220C is a second reconfigured version of SRAM cell 205B, and as such sub-circuit 220C includes: memory-adapted NMOS transistors N2C and N4C. Sub-circuit 220D is a third reconfigured version of SRAM cell 205B, and as such sub-circuit 220D includes: memory-adapted NMOS transistors N1D and N3D.

As a part of the first reconfigured version of SRAM cell 205B which sub-circuit 220B represents, similar to how transistors P1A-P2A and N1A-N2A of SRAM cell 205B are configured as a latch 218A of SRAM cell 205B, transistors P1B-P2B and N1B-N2B of sub-circuit 220B are configured a latch 218B of sub-circuit 220B. Similar to latch 218A of SRAM cell 205B, latch 218B of sub-circuit 220B is connected to power-supply voltage 210. In contrast to latch 218A of SRAM cell 205B, latch 218B of sub-circuit 220B is selectively connected to the ground voltage through a first path and a second path. The first path includes a third node, where the third node corresponds to a segment 226A (which has been added), and a portion provided by sub-circuit 220D (as discussed in more detail below). The second path includes a fourth node, where the fourth node corresponds to a segment 226B (which has been added), and a portion provided by sub-circuit 220C (as discussed in more detail below). Also because sub-circuit 220B is the first reconfigured version of SRAM cell 205B, segments 234B' and 234B" are not used in sub-circuit 220B and accordingly are shown as corresponding phantom segments between source electrodes of corresponding transistors N1B and N2B and the ground voltage. In some embodiments, a phantom element, e.g., phantom segment 234B' or 234B", is a dummy structure which is present but which lacks an electrical connection to each of the source electrodes of each of transistors N1B and N2B. As such, if an integrated circuit which includes such phantom elements were to be 'peeled,' e.g., examined under an electron-microscope, then such phantom elements would be present as remnants of SRAM cell 205 which remain from the reconfiguration of SRAM cell 205 into sub-circuit. In some embodiments, a phantom element, e.g., phantom segment 234B' or 234B", is a structure which was removed and thus is no longer present.

Also as a part of the first reconfigured version of SRAM cell 205B which sub-circuit 220B represents, a first drain/source electrode of transistor N3B is connected to bit line BL, a segment 224B' has been added which connects the gate electrode of transistor N3B to bit line BL, and a segment 224B" has been added which connects the second drain/source electrode of transistor N3B to the second node, where the second node corresponds to segment 232B. Together, segment 224B' and segment 224B" represent a shunt. As a result, transistor N3B has a 'bypass' configuration wherein transistor N3B is placed in parallel with series connected segments 224B' and 224B" between the bit line BL and the second node (segment 232B). Consequently, the second node (segment 232B) of latch 218B is directly connected to the bit line BL. Similarly, a first drain/source electrode of transistor N4B is connected to bit_bar line BLB, a segment 225B' has been added which connects the gate electrode of transistor N4B to bit_bar line BLB, and a segment 225B" has been added which connects the second drain/source electrode of transistor N4B to the first node, where the first node corresponds to segment 230B. Together, segment 225B' and segment 225B" represent a shunt. As a result, transistor N4B has the bypass configuration wherein transistor N4B is placed in parallel with series connected segments 225B' and 225B" between the bit_bar line BLB and the first node (segment 230B). Consequently, the first node (segment 230B) of latch 218B is directly connected to the bit_bar line BLB.

As a part of the second reconfigured version of SRAM cell 205B which sub-circuit 220C represents, the second path (by which latch 218B of sub-circuit 220B is selectively connected to the ground voltage) includes transistor N2C of sub-circuit 220C. The source electrode of transistor N2B of latch 218B of sub-circuit 220B is connected to a first end of segment 226B. A second end of segment 226B is connected to a drain electrode of transistor N2C of sub-circuit 220C. A source electrode of transistor N2C of sub-circuit 220C is connected to the ground voltage. A segment 261C has been added which connects a gate electrode of transistor N2C of sub-circuit 220C to a latch-enable signal-line. In some embodiments, the latch-enable signal line is latch-enable signal line 243A of FIG. 2A. The signal Latch_en<202B> on the latch-enable signal-line is a control signal which is appropriately configured to selectively induce an ON/OFF state in transistor N2C and thereby selectively connect the source electrode of transistor N2B of latch 218B of sub-circuit 220B to the ground voltage, and more generally turn ON/OFF WAS circuit 212B.

Also as a part of the second reconfigured version of SRAM cell 205B which sub-circuit 220C represents, a segment 243C has been added which connects the gate electrode of transistor N4C to the ground voltage, resulting in transistor N4C having an 'always-OFF' configuration for NMOS transistors. In the always-OFF configuration, an NMOS transistor is always turned off and so, e.g., always conducts little if any current and always represents a high resistance conduction path. Consequently, segments 242C and 248C are not used in sub-circuit 220C and accordingly are shown as corresponding phantom segments. Write line WL<220B> is not used in sub-circuit 220C and accordingly is shown as a phantom write line. In some embodiments, transistor N4C of sub-circuit 220C is not used and accordingly would be shown as a phantom transistor.

Because sub-circuit 220C is the second reconfigured version of SRAM cell 205B, some other components of SRAM cell 205B are not used in sub-circuit 220C. Transistors P1C, P2C, N1C and N3C are not used in sub-circuit 220C and accordingly are shown as phantom transistors. Segment 240C is not used in sub-circuit 220C and accordingly is shown as a phantom segment. Segment 246C is not used in sub-circuit 220C and accordingly is shown as a phantom segment. Write line WL<220C> is not used in sub-circuit 220C and accordingly is shown as a phantom write line. Segment 234C' is not used in sub-circuit 220C and accordingly is shown as a phantom segment. Segment 232C is not used in sub-circuit 220C and accordingly is shown as a phantom segment.

As a part of the third reconfigured version of SRAM cell 205B which sub-circuit 220D represents, the first path (by which latch 218B of sub-circuit 220B is selectively connected to the ground voltage) includes transistor N1D of sub-circuit 220D. The source electrode of transistor N1B of latch 218B of sub-circuit 220B is connected to a first end of segment 226A. A second end of segment 226A is connected to a drain electrode of transistor N1D of sub-circuit 220D. A source electrode of transistor N1D of sub-circuit 220D is connected to the ground voltage. A segment 269D has been added which connects a gate electrode of transistor N1D of sub-circuit 220D to signal Latch_en<202B> on the latch-enable signal-line thereby to selectively connect the source electrode of transistor N1B of latch 218B of sub-circuit 220B to the ground voltage by selectively turning ON/OFF transistor N1D. The signal Latch_en<202B> is derived from voltage levels available in the memory power-domain.

As integrated circuits are scaled down in size, bit line BL and bit_bar line BLB become increasingly thinner and narrow, and the corresponding resistances of bit line BL and bit_bar line BLB becomes increasingly greater. If not otherwise mitigated, the voltage drops between the starting ends and the terminating ends of corresponding bit line BL and bit_bar line BLB become increasingly greater, with the voltage drops eventually becoming sufficient in amplitude to affect write speed, induce write errors, or the like.

During a write operation, WAS circuit 212B assists the write operation by connecting latch 218B of WAS 212B is connected in parallel with latch 218A of SRAM cell 205B during the write operation.

WAS circuit 212B helps latch 218A of SRAM memory cell 205B to increase (or pulls up) voltages on the corresponding bit line BL and bit_bar line BLB and thereby mitigate write speed differences resulting from starting amplitudes of the voltages at terminating/distal ends of bit line BL and bit_bar line BLB being different than starting amplitudes of the voltages on the corresponding starting/proximal ends of bit line BL and bit_bar line BLB. WAS circuit 212B is powered by voltage levels which are derived from voltage levels available in the memory power-domain. During a write operation, bit line BL and bit_bar line BLB are set to opposite logic values according (or 'developed') to the new data that will be written into SRAM cell 205B. In some embodiments, after voltages representing the opposite logic values have settled (or been 'developed'), when signal wcs<208B> turns on transistors N11A and N12A (thereby selecting column 202B), during a write cycle for column 202B, signal Latch_en<202B> turns on transistors N2C and N1D (thereby more generally turning ON/OFF WAS circuit 212B. In some embodiments, during the write cycle for column 202B, when pass gate transistors N3A and N4A are turned ON/OFF, transistors N2C and N1D are correspondingly turned ON/OFF.

In general, during a write operation, the operation of WAS circuit 212 causes the following pairs of current paths to be connected in parallel: a first pair of a first path represented by pull-up transistor P1B of latch 218B of WAS circuit 212B and a second path represented by pull-up transistor P1A of latch 218A and pass gate transistor N3A of SRAM cell 205B of SRAM memory cell 204B are connected in parallel between power-supply voltage 210 and bit_bar line BLB; second pair of a third path represented by pull-up transistor P2B of latch 218B of WAS circuit 212B and a fourth path represented by pull-up transistor P2A of latch 218A and pass gate transistor N4A of SRAM cell 205B of SRAM memory cell 204B are connected in parallel between power-supply voltage 210 and bit_bar line BLB; a third pair of a fifth path represented by pull-down transistor N1B of latch 218B of WAS circuit 212B and a sixth path represented by pull-down transistor N1A of latch 218A and pass gate transistor N3A of SRAM cell 205B of SRAM memory cell 204B are connected in parallel between the ground voltage 210 and bit_bar line BLB; and a fourth pair of a seventh path represented by pull-down transistor N2B of latch 218B of WAS circuit 212B and an eighth path represented by pull-down transistor N2A of latch 218A and pass gate transistor N4A of SRAM cell 205B of SRAM memory cell 204B are connected in parallel between the ground voltage 210 and bit_bar line BLB.

The operation of WAS circuit 212B will be further explained in the context of an example write operation. For example, in a context of an SRAM write operation, for a given instance of SRAM cell 205B located near the starting ends of corresponding bit line BL and bit_bar line BLB, assume that a logic state "1" stored in data latch 218A is to be reset by setting bit line BL to a logic state "0" and bit_bar line BLB to "1". Because the given instance of SRAM cell 205B is assumed to be located near the starting ends of corresponding bit line BL and bit_bar line BLB, further assume that the voltage on bit line BL is 0V and the voltage on bit_bar line is 0.9V. In response to a binary code from a row decoder (not shown), word line WL<204A> coupled to pass-gate transistors N3A and N4A of SRAM cell 205B is asserted so that latch 218A is selected to proceed to a write operation. After SRAM cell 205B is selected, both the first pass-gate transistor N3A and N4A are turned on. As a result, storage nodes 232A and 230A are connected correspondingly to bit line BL and bit_bar line BLB. Furthermore, storage node 232A of latch 218A is discharged (or pulled down) by transistor N1A to ground voltage thereby to follow "0" on bit line BL, and thereby store "0" at storage node 232A. Also, storage node 230A of latch 218A is charged (or pulled up) by transistor P2A to power-supply voltage 210 (which in some embodiments (again) is VDD for the memory power-domain) thereby to follow "1" on bit_bar line BLB, and thereby store "1" at storage node 230A. As a result, the new data logic "0," corresponding to the voltage on storage node 232A, is 'latched' into SRAM cell 205B. Because the voltage on bit_bar line BLB initially is 0.9V, transistor P2A has to pull the voltage on bit_bar line BLB up from 0.9V to VDD.

Continuing the example, in the context of the SRAM write operation and further assuming that WAS 212B is NOT present, consider a given instance of SRAM cell 205B which is located near the terminating ends of corresponding bit line BL and bit_bar line BLB. Again, assume that a logic state "1" stored in data latch 218A is to be reset by setting bit line BL to a logic state "0" and bit_bar line BLB to "1". Because the given instance of SRAM cell 205B is assumed to be located near the terminating ends of corresponding bit line BL and bit_bar line BLB, further assume that the voltage on bit line BL is 0V and the voltage on bit_bar line is 0.7V, or 0.2V lower than when the given instance of SRAM cell 205B was assumed to be located near the starting ends of corresponding bit line BL and bit_bar line BLB. Because the voltage on bit_bar line BLB initially is 0.9V, transistor P2A has to pull the voltage on bit_bar line BLB up from 0.7V to VDD, which takes longer than pulling up from 0.7V.

Continuing with the example ALBEIT when WAS circuit 212B IS present, bit_bar line BLB is pulled up not only by transistor P2A of latch 218A of SRAM cell 205B, but also by transistor P2B of latch 218B of WAS 212B. In effect, the third current path represented by transistor P2B of latch 218B of WAS 212B and the fourth current path represented by the series connection of transistor P2A of latch 218A and pass gate transistor N4A of SRAM cell 205B are connected in parallel (as the second pair of paths) between power-supply voltage 210 and bit_bar line BLB, which (in some embodiments) approximately doubles the current-capacity available for pulling up the voltage on bit_bar line BLB. In the circumstance of the example, it is also noted: the fourth pair of the seventh path (including transistor N2B) and the eighth path (including transistor N2A) current paths is also connected in parallel to bit_bar line BLB but both transistors N2B and N2A are turned off: third pair of the fifth path (including transistor N1B) and the sixth path (including transistor N1A) is connected in to bit line BL and both transistors N1B and N1A are turned on to pull the voltage on bit line BL to the ground voltage; and the first pair of the first path (including transistor P1B) and the second path (including transistor P1A) is connected in parallel to bit line BL but both transistors P1B and P1A are turned off.

Also as a part of the third reconfigured version of SRAM cell 205B which sub-circuit 220D represents, a segment 241D has been added which connects the gate electrode of transistor N3D to the ground voltage, resulting in transistor N3D having the always-OFF configuration for NMOS transistors. Consequently, segments 240D and 246D are not used in sub-circuit 220D and accordingly are shown as corresponding phantom segments. In some embodiments, transistor N3D of sub-circuit 220D is not used and accordingly would be shown as a phantom transistor.

Because sub-circuit 220D is the third reconfigured version of SRAM cell 205B, some other components of SRAM cell 205B are not used in sub-circuit 220D. Transistors P1D, P2D, N2D and N4D are not used in sub-circuit 220D and accordingly are shown as phantom transistors. Write line WL<220D> is not used in sub-circuit 220D and accordingly is shown as a phantom write line. Segment 234D" is not used in sub-circuit 220D and accordingly is shown as a phantom segment. Segment 230D is not used in sub-circuit 220D and accordingly is shown as a phantom segment.

Figure 3:
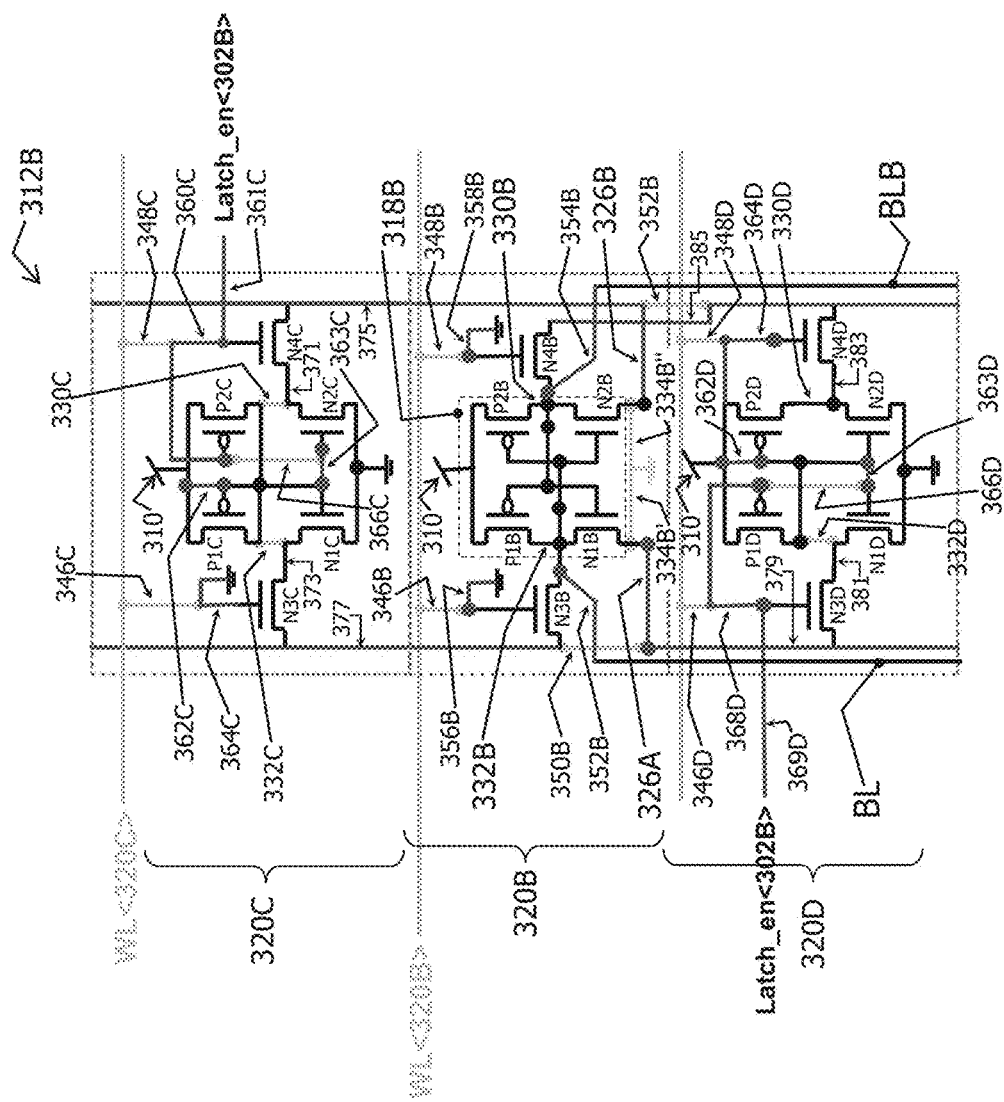
FIG. 3 is a circuit diagram of another WAS circuit, in accordance with at least one embodiment of the present disclosure.

FIG. 3 is a circuit diagram of WAS circuit 312B, in accordance with at least one embodiment of the present disclosure. Relative to FIG. 2B, FIG. 3 shows WAS circuit 312B as an alternative to WAS circuit 212B.

WAS circuit 312B includes sub-circuits 320B, 320C and 320D. It is noted that reference number 320A is not used because reference numbers 320B-320D correspond more intuitively to the transistor numbering scheme (as used herein) than do reference numbers 320A-320C.

Each of sub-circuits 320B-320D is based on a corresponding six transistor (6T) configuration. In some embodiments, different interconnections for the six transistors of corresponding sub-circuits 320B-320D are contemplated. In some embodiments, configurations for corresponding sub-circuits 320B-320D based on a number of transistors other than six are contemplated.

In some embodiments, sub-circuits 320B-320D are corresponding reconfigured versions of SRAM cell 205B of FIG. 2A. In some embodiments, sub-circuits 320B-320D correspond to reconfigured versions of instances/instantiations of a standard cell structure, where the standard cell structure is included in a library of various standard cell structures. In some embodiments, such a library is included in an EDA system (again, see discussion of FIG. 9 below). In some embodiments, sub-circuits 320B-320D are corresponding reconfigured versions of instances/instantiations of another standard SRAM cell in a library of various standard cell structures.

Sub-circuit 320B is a fourth reconfigured version of SRAM cell 205B, and as such sub-circuit 320B includes: memory-adapted PMOS transistors P1B and P2B; and memory-adapted NMOS transistors N1B, N2B, N3B and N4B. Sub-circuit 320C is a fifth reconfigured version of SRAM cell 205B, and as such sub-circuit 320C includes: memory-adapted PMOS transistors P1C and P2C, and memory-adapted NMOS transistors N1C, N2C, N3C and N4C. Sub-circuit 320D is a sixth reconfigured version of SRAM cell 205B, and as such sub-circuit 320D includes: memory-adapted PMOS transistors P1D and P2D, and memory-adapted NMOS transistors N1D, N2D, N3D and N4D.

As a part of the fourth reconfigured version of SRAM cell 205B which sub-circuit 320B represents, similar to how transistors P1B-P2B and N1B-N2B of sub-circuit 220B are configured as latch 218B of sub-circuit 220B, transistors P1B-P2B and N1B-N2B of sub-circuit 320B are configured as latch 318B of sub-circuit 320B. Similar to latch 218B of SRAM cell 205B, latch 318B of sub-circuit 320A is: connected to power-supply voltage 310; and selectively connected to the ground voltage through a third path and a fourth path. The third path includes a segment 326A (which has been added), a segment 379 (which has been added) and a portion provided by sub-circuit 320D (as discussed in more detail below). The fourth path includes a segment 326B (which has been added), a segment 375 (which has been added) and a portion provided by sub-circuit 320C (as discussed in more detail below). Also because sub-circuit 320B is the fourth reconfigured version of SRAM cell 205B, segments 334B' and 334B" are not used in sub-circuit 320B and accordingly are shown as corresponding phantom.

Also as a part of the fourth reconfigured version of SRAM cell 205B which sub-circuit 320B represents, a segment 356B has been added which connects the gate electrode of transistor N3B to the ground voltage, resulting in transistor N3B having the always-OFF configuration for NMOS transistors. A segment 358B has been added which connects the gate electrode of transistor N4B to the ground voltage, resulting in transistor N4B having the always-OFF for NMOS transistors. Consequently, segments 346B and 348B are not used in sub-circuit 320B and accordingly are shown as corresponding phantom segments. Write line WL<320B> is not used in sub-circuit 320B and accordingly is shown as a phantom write line. Line segments 350B and 352B are not used in sub-circuit 320B and accordingly are shown as phantom segments.

Yet also as a part of the fourth reconfigured version of SRAM cell 205B which sub-circuit 320B represents, a first drain/source electrode of transistor N3B is connected to the second node, where the second node corresponds to segment 332B. A first drain/source electrode of transistor N4B is connected to the first node, where the first node corresponds to segment 330B. Notwithstanding the always-OFF configurations of transistors N3B and N4B of sub-circuit 320B, a segment 377 has been added which connects to a second drain/source electrode of transistor N3B, and a segment 385 has been added which connects to a second drain/source electrode of transistor N4B. In some embodiments, each of segments 377 and 385 is not connected to a voltage source so as to be regarded as 'floating.' In some embodiments, transistors N3B and/or N4B of sub-circuit 320B are not used and accordingly would be shown as corresponding phantom transistors. In some embodiments, segments 377 and/or 385 are not used and accordingly would be shown as corresponding phantom segments.

As a part of the fifth reconfigured version of SRAM cell 205B which sub-circuit 320C represents, a segment 360C has been added which connects the gate electrode of transistor N4C to the gate electrode of transistor P2C. A segment 361C has been added which connects segment 360C and the gate electrode of transistor N4C of sub-circuit 320C to a latch-enable signal-line. In some embodiments, the latch-enable signal line is latch-enable signal line 243A of FIG. 2A. The signal on the latch-enable signal-line is a control signal which is appropriately configured to selectively induce an ON/OFF state in transistor N2C, and conversely a corresponding OFF/ON in transistor P2C, and thereby selectively connect the source electrode of transistor N2B of latch 218B of sub-circuit 320B to the ground voltage. A segment 362C has been added which connects the gate electrode of transistor P1C to power-supply voltage 310, resulting in transistor P1C having an always-OFF configuration for PMOS transistors. In the always-OFF configuration, a PMOS transistor is always turned off and so, e.g., always conducts little if any current and always represents a high resistance conduction path. A segment 363C has been added which connects the gate electrode of transistor N2C to the gate electrodes of each of transistors P1C and N1C, and thereby to power-supply voltage 310. Accordingly, transistors N1C and N2C have an 'always-ON' configuration for NMOS transistors wherein the gate electrode of each of transistors N1C and N2C is connected to power-supply voltage 310. In the always-ON configuration, an NMOS transistor is always turned on and so, e.g., always conducts substantial if not maximum current and always represents a low resistance conduction path. Similarly, in an always-ON configuration for a PMOS transistor, the PMOS transistor is always turned on and so, e.g., always conducts substantial if not maximum current and always represents a low resistance conduction path. A segment 364C has been added which connects the gate electrode of transistor N3C to power-supply voltage 310, resulting in transistor N3C having the always-OFF configuration for NMOS transistors. A segment 330C otherwise connecting the drain electrode of transistor P2C to the drain electrode of transistor N2C is not used and accordingly is shown as a phantom segment. A segment 332C otherwise connecting the drain electrode of transistor P1C to the drain electrode of transistor N1C is not used and accordingly is shown as a phantom segment. A segment 366C otherwise connecting the gate electrode of transistor P2C to the gate electrode of transistor N2C is not used and accordingly is shown as a phantom segment.

Also as a part of the fifth reconfigured version of SRAM cell 205B which sub-circuit 320C represents, the fourth path (by which latch 318B of sub-circuit 320B is selectively connected to the ground voltage) includes series-connected transistors N2C and N4C of sub-circuit 320C. Transistor N4C of sub-circuit 320C is connected between segment 375 and the drain electrode of transistor N2C of sub-circuit 320C. The drain electrode of transistor N2C of sub-circuit 320C is connected to the source electrode of transistor N4C of sub-circuit 320C, and the source electrode of transistor N2C of sub-circuit 320C is connected to the ground voltage.

As a part of the sixth reconfigured version of SRAM cell 205B which sub-circuit 320D represents, a segment 368D has been added which connects the gate electrode of transistor N3D to the gate electrode of transistor P1D. A segment 369D has been added which connects segment 368D and the gate electrode of transistor N3B of sub-circuit 320D to the latch-enable signal-line. In some embodiments, the latch-enable signal line is latch-enable signal line 243A of FIG. 2A. Again, the signal on the latch-enable signal-line is a control signal which is appropriately configured to selectively induce an ON/OFF state in transistor N3D, and conversely a corresponding OFF/ON in transistor P1D. A segment 362D has been added which connects the gate electrode of transistor P2D to power-supply voltage 310, resulting in transistor P2D having the always-OFF configuration for PMOS transistors. A segment 363D has been added which connects the gate electrode of transistor N1D to the gate electrodes of each of transistors P2D and N2D, and thereby to power-supply voltage 310. Accordingly, transistors N1D and N2D have an 'always-ON' configuration for NMOS transistors wherein the gate electrode of each of transistors N1D and N2D is connected to power-supply voltage 310. A segment 364D has been added which connects the gate electrode of transistor N4D to power-supply voltage 310, resulting in transistor N4D having the always-OFF configuration for NMOS transistors. A segment 332D otherwise connecting the drain electrode of transistor P1D to the drain electrode of transistor N1D is not used and accordingly is shown as a phantom segment. A segment 366D otherwise connecting the gate electrode of transistor P1D to the gate electrode of transistor N1D is not used and accordingly is shown as a phantom segment.

Also as a part of the fifth reconfigured version of SRAM cell 205B which sub-circuit 320D represents, the third path (by which latch 318B of sub-circuit 320B is selectively connected to the ground voltage) includes series-connected transistors N3D and N1D of sub-circuit 320C. Transistor N3D of sub-circuit 320D is connected between segment 379 and the drain electrode of transistor N1D of sub-circuit 320D. The drain electrode of transistor N1D of sub-circuit 320D is connected to the source electrode of transistor N3D of sub-circuit 320D, and the source electrode of transistor N1D of sub-circuit 320D is connected to the ground voltage.

FIG. 4A is a circuit diagram of a WAS circuit 412B, in accordance with at least one embodiment of the present disclosure. WAS circuit 412B is a simplified version of WAS circuit 312B of FIG. 3.

More particularly, WAS circuit 412B is simplified in the sense that WAS circuit 412B shows elements of WAS 312B which are in use and does not show elements of WAS 312B which are not in use. In some instances, a 'mapping' of correspondences between a layout 449 of FIG. 4B (discussed below) and FIG. 3 is more easily discerned by mapping FIG. 4B (again, discussed below) to FIG. 4A because of the simplification which FIG. 4A represents. Aspects of WAS circuit 412B are shown with corresponding labels A-F, EN (corresponding, e.g., to Latch_en<202B> of FIGS. 2A-2B, VDD, VSS and VSS=PIN. The labels A-F, EN, VDD, VSS and VSS=PIN are also shown on corresponding aspects of layout 449 of FIG. 4B (again, discussed below).

FIG. 4B is a layout diagram 449 of WAS circuit 412B, in accordance with at least one embodiment of the present disclosure.

In some embodiments, a method of generating layout diagram 449 is executed by a processor of a computer. An example of the processor is a processor 902 of FIG. 9 (discussed below). An example of the computer is an electronic design automation (EDA) system 900 of FIG. 9 (discussed below). In some embodiments, such a method is executed by the processor of the computer. In some embodiments, the layout generated by such a method is stored on a non-transitory computer-readable medium. An example of such a layout as stored in a non-transitory computer-readable medium is layout 907 of FIG. 9 (discussed below).

As will be discussed in more detail below, layout diagram 449 includes: a substrate 450; active area (alternatively known as oxide-dimensioned area or oxide-definition area) patterns 452A-452I; MD patterns 454A-454V; CMD patterns 456A-456Z and 458A-458C; PO patterns 460A-460M; CPO patterns 462A-462L; VDR patterns 464A-464F; VG patterns 466A-466L; and VD patterns 468A-468J.

Active area patterns 452A-452I represent active area patterns of a semiconductor device. In some embodiments, active area patterns 452A-452I represent fins of a corresponding finFETs. MD patterns 454A-454V represent portions of a metallization layer. In some embodiments, MD 454A-454V represent portions of first metallization layer disposed above active area patterns 452A-452I, where the first metallization layer is M0 or M1 depending upon the metallization numbering scheme which has been employed. In some embodiments, MD patterns 454A-454V are designated as drain/source terminals/lines. CMD patterns 456A-456Z and 458A-458C represent cut patterns which are disposed over portions of corresponding MD patterns 454A-454V, and which indicate that any corresponding portions of MD patterns 454A-454V lying underneath CMD patterns 456A-456Z and 458A-458C are intended to be cut/removed. PO patterns 460A-460M represent portions of a conductive layer which are disposed over corresponding active area patterns 452A-452I and over corresponding CMD patterns 456A-456Z and 458A-458C. In some embodiments, PO patterns 460A-460M are designated as gate electrodes/lines. CPO patterns 462A-462L represent cut patterns which are disposed over portions of corresponding PO patterns 460A-460M and which indicate that any corresponding portions of PO patterns 460A-460M lying underneath CPO patterns 462A-462L are intended to be cut/removed. VDR patterns 464A-464F represent portions of a conductive layer which connect portions of corresponding MD patterns 456J, 454P, 454U, 454E, 454K and 454V, and portions of corresponding PO patterns 460E, 460I, 460K, 460A, 460F, and 460L. In some embodiments, VDR patterns 464A-464F represent vias. VG patterns 466A-466L represent portions of a conductive layer which connect portions of corresponding VDR patterns 464A-464F and corresponding portions of PO patterns 460B, 460D, 460H, 460C, 460G, 460H, 460K and 460L. In some embodiments, VG patterns 466A-466L represent vias. VD patterns 468A-468J represent portions of a conductive layer which connect portions of corresponding MD patterns 454A, 454R, 454J, 454H, 454M, 454P, 454S, 454C and 454T to corresponding portions of an overlying metallization layer (not shown). In some embodiments, VD 468A-468J patterns represent vias.

In FIG. 4B, active area patterns 452A-452I are formed as substantially rectangular shapes disposed on and/or over substrate 450, where long axes of active area patterns 452A-452I are substantially parallel to a first direction. In some embodiments, active area patterns 452A-452I have shapes other than substantially rectangular. Active area patterns 452A-452I are arranged relative to a first grid which is imaginary and which includes parallel first reference lines/tracks which are imaginary and which lie parallel to the first direction. In FIG. 4B, the first direction is the horizontal direction. In some embodiments, the first direction is a direction other than the horizontal direction. Active area patterns 452A-452I are separated by gaps, relative to a second direction, where the second direction is substantially perpendicular to the first direction. In FIG. 4B, the second direction is the vertical direction. In some embodiments, the second direction is a direction other than the vertical direction. Relative to the first direction, active area patterns 452A-452I are non-overlapping. Relative to the second direction, active area patterns 452C, 452D and 452E are aligned albeit non-overlapping. Relative to the second direction, active area pattern 452F and 452G are aligned albeit non-overlapping.

In some embodiments, active area patterns 452A-452I are designated to be configured for planar FET technology. In some embodiments, again, active area patterns 452A-452I are designated to be configured for finFET technology. Where active area patterns 452a-452I are designated for finFET technology and are included in a layout diagram, a semiconductor device resulting from the layout diagram is a semiconductor device which includes instances of fins (not shown) arranged substantially at least parallel to, if not collinearly with respect to, corresponding ones of the first reference lines/tracks, and thus are substantially parallel to the horizontal direction. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Additional details regarding the structure and manufacture of CMOS finFET technology are disclosed in commonly assigned U.S. Pat. No. 8,786,019, granted Jul. 22, 2014, the entirety of which is hereby incorporated by reference.

In FIG. 4B, MD patterns 454A-454V are formed as substantially rectangular shapes over corresponding active area patterns 452A-452H, where long axes of MD patterns 454A-454V are substantially parallel to the second direction. Relative to the second direction, MD patterns 454A-454V are non-overlapping. Again, MD patterns 454A-454V represent portions of a metallization layer. In some embodiments, again, MD patterns 454A-454V are designated as drain/source terminals/lines. In some embodiments, MD patterns 454A-454V have shapes other than substantially rectangular. MD patterns 454A-454V are arranged relative to a second grid which is imaginary and which includes parallel second reference lines/tracks which are imaginary and which lie parallel to the second direction.

Also in FIG. 4B, CMD patterns 456A-456Z and 458A-458C are formed as substantially rectangular shapes disposed over portions of corresponding MD patterns 454A-454V. Again, CMD patterns are cut patterns indicating that any corresponding portions of MD patterns 454A-454V lying underneath CMD patterns 456A-456Z and 458A-458C are intended to be cut/removed. CMD patterns 456A-456Z and 458A-458C are arranged relative to the first grid. In some embodiments, CMD patterns 456A-456Z and 458A-458C have shapes other than substantially rectangular.

Relative to the first direction: CMD patterns 456A-456Z and 458A-458C are separated by gaps; and CMD patterns 456A-456Z and 458A-458C are non-overlapping. Relative to the second direction, CMD patterns 456A-456E are aligned. Relative to the second direction, CMD patterns 456A-456E are abutting. In some embodiments, one or more of CMD patterns 456A-456E are separated by gaps relative to the second direction. Relative to the second direction, CMD pattern 456E and 456F are aligned and separated by a gap. Relative to the second direction, CMD patterns 456G-456M are aligned. Relative to the second direction, CMD patterns 456G-456I are abutting, and CMD patterns 456J-456L are abutting. In some embodiments, one or more of CMD patterns 456G-456L are separated by gaps relative to the second direction. Relative to the second direction: CMD pattern 456I and 456J are aligned and separated by a gap; CMD pattern 456L and 456M are aligned and separated by a gap; and CMD pattern 456N and 456O are aligned and separated by a gap. Relative to the second direction, CMD patterns 456P-456V are aligned. Relative to the second direction: CMD patterns 456P-456R are abutting; and CMD patterns 456S-456U are abutting. In some embodiments, one or more of CMD patterns 456P-456U are separated by gaps relative to the second direction. Relative to the second direction: CMD pattern 456R and 456S are aligned and separated by a gap; and CMD pattern 456U and 456V are aligned and separated by a gap. Relative to the second direction, CMD patterns 456W-456Z and 458A-458C are aligned. Relative to the second direction: CMD patterns 456W-456Z and 458A are abutting; and CMD patterns 458B-458C are abutting. In some embodiments, one or more of CMD patterns 456W-456Z and 458A-458C are separated by gaps relative to the second direction. Relative to the second direction: CMD pattern 458A and 458B are aligned and separated by a gap.

In FIG. 4B, PO patterns 460A-460M are formed as substantially rectangular shapes which are disposed over corresponding active area patterns 452A-452H and over corresponding CMD patterns 456A-456Z and 458A-458C, where long axes of PO patterns 460A-460M are substantially parallel to the second direction. Relative to the second direction, PO patterns 460A-460M are non-overlapping. PO patterns 460A-460M represent portions of a conductive layer. In some embodiments, again, PO patterns 460A-460M are designated as gate electrodes/lines. In some embodiments, the conductive layer is formed of polysilicon or the like. In some embodiments, PO patterns 460A-460M have shapes other than substantially rectangular. PO patterns 460A-460M are arranged relative to the second grid.

Also in FIG. 4B, CPO patterns 462A-462L are formed as substantially rectangular shapes which are disposed over portions of corresponding PO patterns 460A-460M. Again, CPO patterns 462A-462L are cut patterns indicating that any corresponding portions of PO patterns 460A-460M lying underneath CPO patterns 462A-462L are intended to be cut/removed. CPO patterns 462A-462L are arranged relative to the first grid. In some embodiments, CPO patterns 462A-462L have shapes other than substantially rectangular.

Relative to the first direction: CPO patterns 462A-462L are separated by gaps; and CPO patterns 462A-462L are non-overlapping. Relative to the second direction: CPO patterns 462A-462D are aligned. Relative to the second direction, CPO patterns 462A-462B are abutting. In some embodiments, CPO patterns 462A-462B are separated by a gap relative to the second direction. Relative to the second direction, CPO pattern 462B and 462C are aligned and separated by a gap; and CPO patterns 462C and 462D are aligned and separated by a gap. Relative to the second direction, CPO patterns 462E-462F are aligned and abutting. In some embodiments, CPO patterns 462E-462F are separated by a gap relative to the second direction. Relative to the second direction, CPO pattern 462G and 462H are aligned and separated by a gap; and CPO patterns 462H-462J are aligned. Relative to the second direction, CPO patterns 462H-462I are abutting. In some embodiments, CPO patterns 462H-462I are separated by a gap relative to the second direction. Relative to the second direction, CPO pattern 462I and 462J are aligned and separated by a gap.

In FIG. 4B, represent portions of a conductive layer which connect portions of corresponding MD patterns 456J, 454P, 454U, 454E, 454K and 454V, and PO patterns 460E, 460I, 460K, 460A, 460F, and 460L. For example, VDR pattern 364A is formed over MD pattern 456J and PO pattern 460E, VDR pattern 364B is formed over MD pattern 454P and PO pattern 460I, and the like. Again, VDR patterns 464A-464F represent portions of a conductive layer which connect portions of corresponding MD patterns 456J, 454P, 454U, 454E, 454K and 454V, and portions of corresponding PO patterns 460E, 460I, 460K, 460A, 460F, and 460L. Again, in some embodiments, VDR patterns 464A-464F represent vias. In some embodiments, VDR patterns 464A-464F are formed as substantially rectangular shapes In some embodiments, VDR patterns 464A-464F have shapes other than substantially rectangular.

Also in FIG. 4B, again, VG patterns 466A—represent portions of a conductive layer which connect portions of corresponding VDR patterns 464A-464F and corresponding portions of PO patterns 460B, 460D, 460H, 460C, 460G, 460H, 460K and 460L. For example, VG pattern 466A is formed over PO pattern 460B, VG pattern 466B is formed over PO pattern 460D, VG pattern 466D is formed over VDR pattern 464A, PO pattern 466E is formed over VDR pattern 464B, and the like. Again, in some embodiments, VG patterns 466A-466L represent vias. VG patterns 466A-466L are formed as substantially square shapes. In some embodiments, VG patterns 466A-466L have shapes other than substantially square.

Yet also in FIG. 4B, again, VD patterns 468A-468J represent portions of a conductive layer which connect portions of corresponding MD patterns 454A, 454R, 454J, 454H, 454M, 454P, 454S, 454C and 454T to corresponding portions of an overlying metallization layer (not shown). For example, VD pattern 468A is formed over MD pattern 454A, VD pattern 468B is formed over MD pattern 454R, and the like. Again, in some embodiments, VD patterns 468A-468J represent vias. In some embodiments, VD patterns 468A-468J are formed as substantially square shapes In some embodiments, VD patterns 468A-468J have shapes other than substantially square.

FIGS. 5A-5H are waveforms 504A-506A showing an improved write-margin performance using a WAS circuit wherein the WAS circuit is in accordance with at least one embodiment of the present disclosure.

In FIGS. 5A, 5C, 5E and 5G, corresponding waveforms 504A, 504C, 504E and 504G represent a voltage BLin on a node, e.g., node 232A FIG. 2A, in a circumstance in which a WAS circuit is NOT present. In FIGS. 5A, 5C, 5E and 5G, corresponding waveforms 508A, 508C, 508E and 508G represent a voltage BLBin on a node, e.g., node 230A FIG. 2A, in a circumstance in which a WAS circuit is NOT present. In FIGS. 5A, 5C, 5E and 5G, corresponding waveforms 506A, 506C, 506E and 506G represent voltage BLin on a node, e.g., node 232A, in a circumstance in which a WAS circuit (in accordance with at least one embodiment of the present disclosure) is present. In FIGS. 5A, 5C, 5E and 5G, corresponding waveforms 510A, 510C, 510E and 510G represent a voltage BLBin on a node, e.g., node 230A, in a circumstance in which a WAS circuit (in accordance with at least one embodiment of the present disclosure) is present.

In FIGS. 5B, 5D, 5F and 5H, corresponding waveforms 504B, 504D, 504F and 504H represent a voltage on a bit line, e.g., bit line BL in FIG. 2A, in a circumstance in which a WAS circuit is NOT present. In FIGS. 5B, 5D, 5F and 5H, corresponding waveforms 508B, 508D, 508F and 508H represent a voltage on a bit_bar line, e.g., bit_bar line BLB in FIG. 2A, in a circumstance in which a WAS circuit is NOT present. In FIGS. 5B, 5D, 5F and 5H, corresponding waveforms 506B, 506D, 506F and 506H represent a voltage on a bit line, e.g., bit line BL in FIG. 2A, in a circumstance in which a WAS circuit (in accordance with at least one embodiment of the present disclosure) is present. In FIGS. 5B, 5D, 5F and 5H, corresponding waveforms 510B, 510D, 510F and 510H represent a voltage on a bit_bar line, e.g., bit_bar line BLB in FIG. 2A, in a circumstance in which a WAS circuit (in accordance with at least one embodiment of the present disclosure) is present.

In FIG. 5A, a gap 512A between waveforms 504A and 508A represents a write-operation failure. In FIG. 5A, an intersection 514A of waveforms 506A and 510A represents a successful write-operation. In FIG. 5C, a shift to the left (reference 514C) of waveform 510C relative to waveform 508C represents a reduction in write time. In FIG. 5E, an intersection 512E between waveforms 504E and 508E represents a write-operation failure. In FIG. 5E, an intersection 514E of waveforms 506E and 510E represents a successful write-operation. FIGS. 5A and 5E show that the WAS circuit, e.g., WAS circuit 212B, improves write capability even in a circumstance in which insufficient write-time (write duration) is provided. In FIG. 5G, a shift to the left (reference 514G) of waveform 506G relative to waveform 504G represents a reduction in write time. Recalling that the WAS circuit, e.g., WAS circuit 212B, is formed of memory-adapted transistors rather than being formed of logic-adapted transistors as in the noted other approach, at least one of (A) or (B) is true: (A) the footprint of WAS circuit 212B and a corresponding array of memory cells is smaller than the footprint of the corresponding WAS circuit according to the other approach and the array of memory cells; or (B) relative to the array of memory cells, WAS circuit 212B is located physically closer than the WAS circuit according to the other approach. Accordingly, in light of at least one of (A) or (B) being true, a beneficial result is that a shorter line connects WAS circuit 212B to a corresponding bit line than would connect the WAS circuit of the other approach to the corresponding bit line. All other factors being equal, a shorter line connecting WAS circuit 212B to the corresponding bit line represents less resistance through which WAS circuit 212B must drive current, which manifests as a reduction in write time, as indicated by the shift to the left (reference 514C) of waveform 510C relative to waveform 508C in FIG. 5C, and as indicated by the shift to the left (reference 514G) of waveform 506G relative to waveform 504G in FIG. 5G.

Figure 6A:
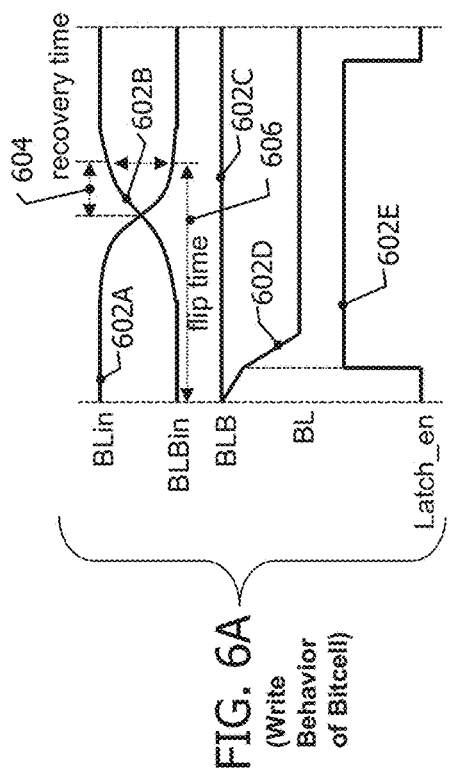
FIG. 6A is a graph of waveforms showing improvements in voltage level changes when accessing an SRAM memory cell such as SRAM memory cell 205B, in accordance with at least one embodiment of the present disclosure.

FIG. 6A is a graph of waveforms 602A-602D showing improvements in voltage level changes when accessing an SRAM memory cell such as SRAM memory cell 205B, in accordance with at least one embodiment of the present disclosure.

In FIG. 6A, together, waveforms 602A-602D describe SRAM memory cell 205B in the context of a write operation. More particularly, waveform 602A represents voltage BLin. Waveform 602B represents voltage BLBin. Waveform 602C represents a voltage on a bit-bar line BLB. Waveform 602D represents a voltage on a bit line BL. Waveform 602E represents a latch-enable signal. Item 604 indicates a recovery-time. Item 606 indicates a flip-time. In general, flip time refers to an amount of time which elapses while one or more waveforms flip/reverse state(s). In FIG. 6A, in particular, flip time 606 refers to a change of state of waveform 602A and a corresponding change of state in waveform 602B. More particularly, assuming a circumstance in which waveform 602A represents a logical high state of voltage BLin and waveform 602B represents a logical low state of voltage BLBin, flip-time 606 refers to an amount of time which elapses while waveform 602A (voltage BLin) changes from the logical high state to the logical low state and waveform 602B (voltage BLBin) changes from the logical low state to the logical high state. In some embodiments, the flip-time refers to a change of state other than the change of state indicated by item 606 in FIG. 6A.

FIGS. 6B-6F are waveforms showing improvement in performance using a WAS circuit corresponding to the waveforms graphed in FIG. 6A wherein the WAS circuit is in accordance with at least one embodiment of the present disclosure.

Figure 6C:
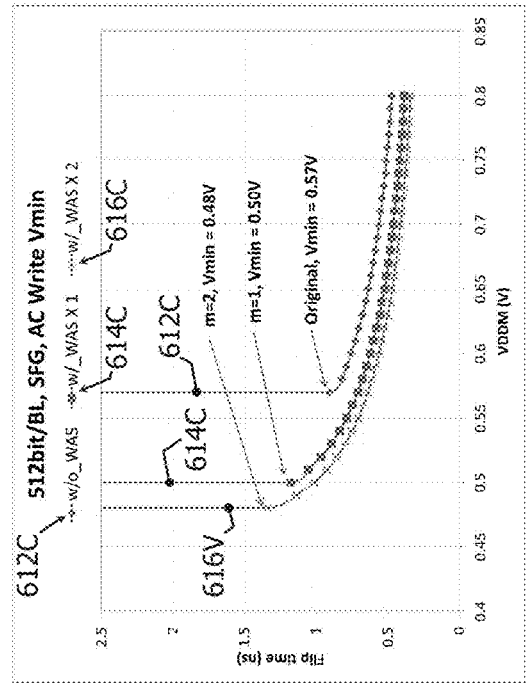
FIGS. 6B-6F are waveforms showing improvement in performance using a WAS circuit corresponding to the waveforms graphed in FIG. 6A wherein the WAS circuit is in accordance with at least one embodiment of the present disclosure.
Figure 6D:
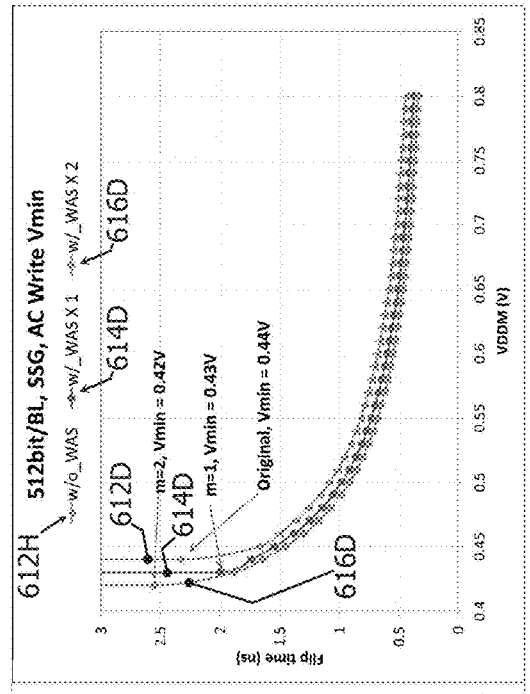
Figure 6B:
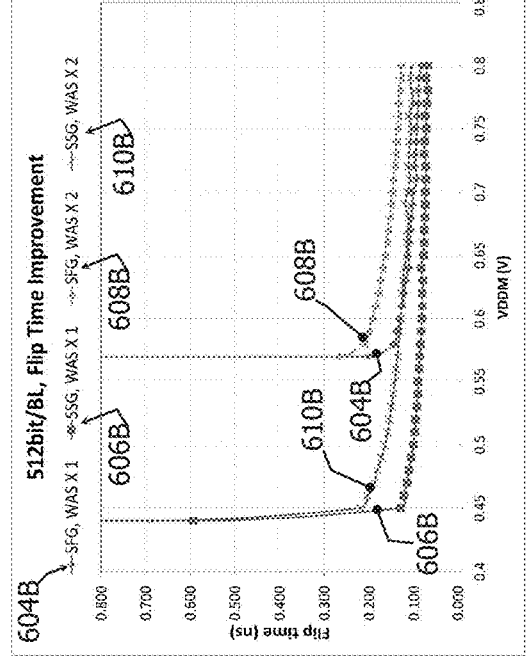

In FIG. 6B, waveforms 604B-610B show improvement in terms of reduced flip-times (see item 606 of FIG. 6A). Waveforms 604B-610B are normalized such that waveforms 604B and 606B represent performance of a WAS circuit with one unit (1X) of driving capability, and waveforms 608B and 610B represent performance of a WAS circuit with two units (2X) of driving capability. The WAS circuits of waveforms 604B and 608B are a slow-fast-global (SFG) type of corresponding WAS circuits. The WAS circuits of waveforms 606B and 610B are a slow-slow-global (SSG) type of corresponding WAS circuits.

In FIGS. 6C-6D, corresponding waveforms 612C-616C and 612D-616D show improvement in terms of reduced minimum write operation voltage (AC Write Vmin). Waveforms 612C and 612D represent performance in a circumstance in which a WAS circuit is NOT present. Waveforms 614C-616C and 614D-616D are normalized such that waveforms 614C and 614D represent performance of a WAS circuit with one unit (1X) of driving capability, and waveforms 616C and 616D represent performance of a WAS circuit with two units (2X) of driving capability.

Figure 6E:
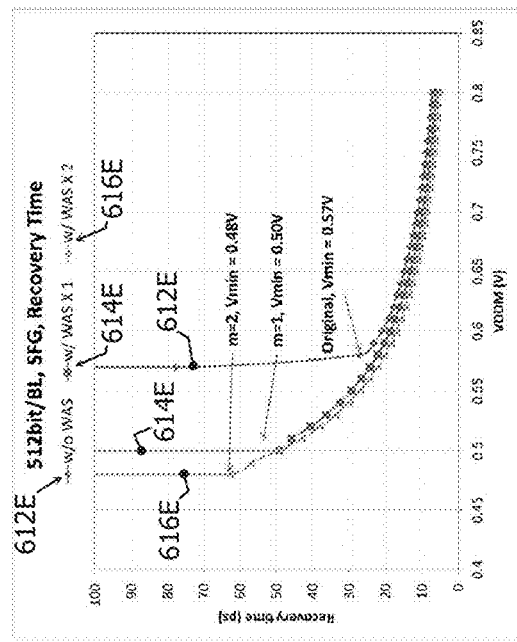
Figure 6F:
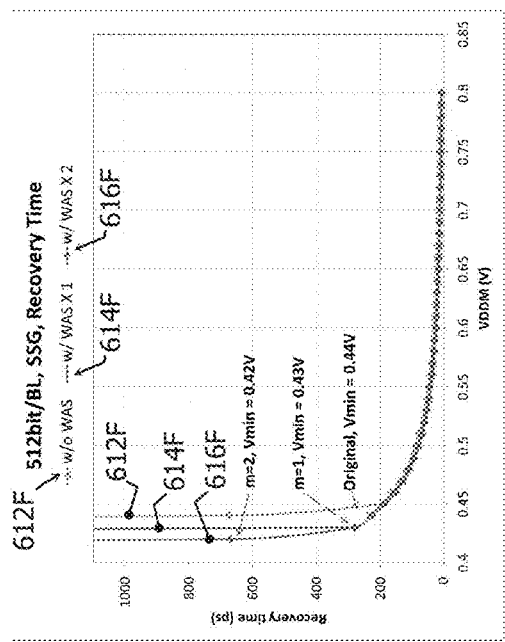

In FIGS. 6E-6F, corresponding waveforms 612G-616G and 612H-616H show improvement in terms of reduced recovery time (see item 604 of FIG. 6A. Waveforms 612E and 612F represent performance in a circumstance in which a WAS circuit is NOT present. Waveforms 614E-616F and 614E-616F are normalized such that waveforms 614E and 614F represent performance of a WAS circuit with one unit (1X) of driving capability, and waveforms 616E and 616F represent performance of a WAS circuit with two units (2X) of driving capability.

Figures 7A, 7B:
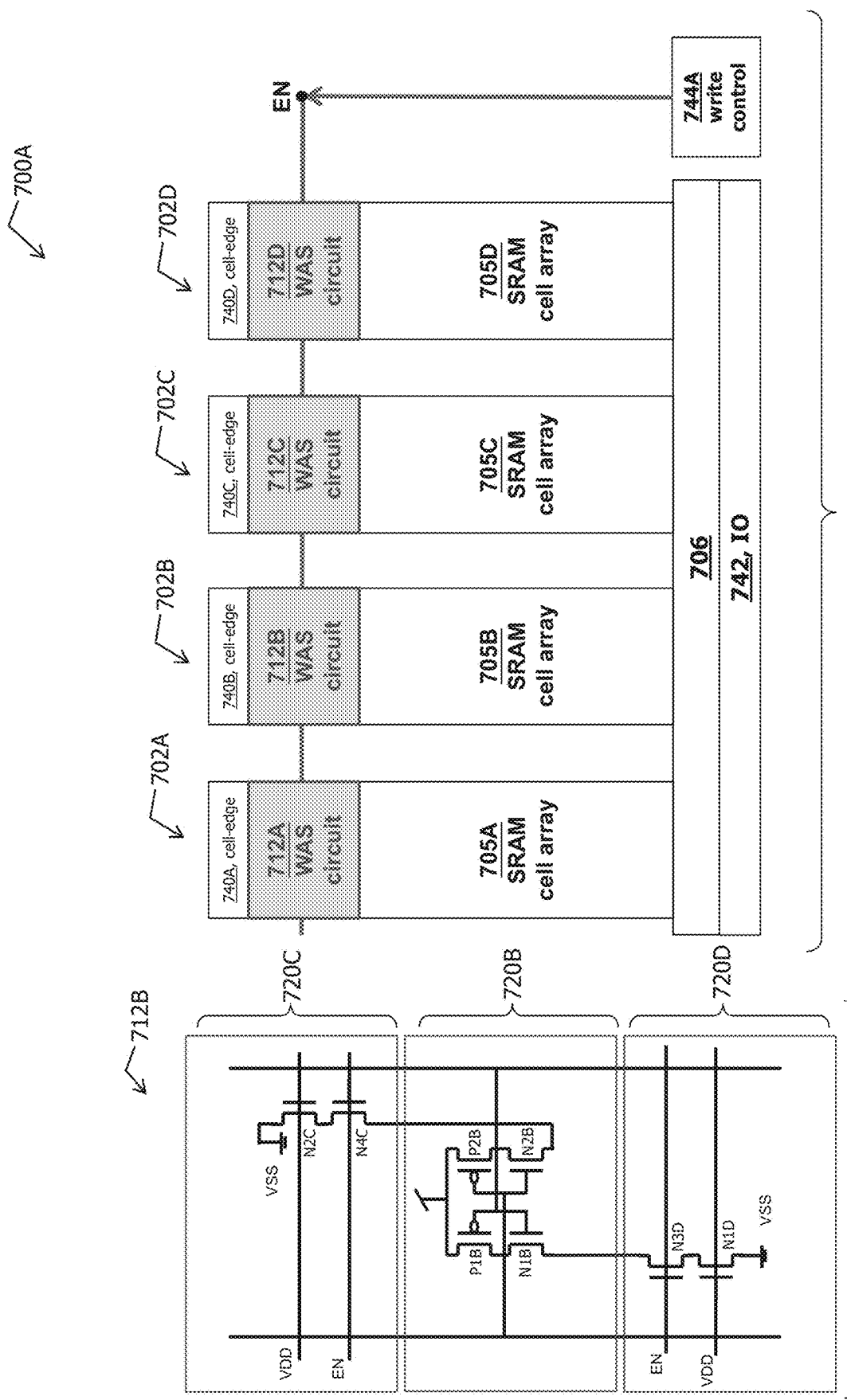
FIG. 7A is a block diagram of another SRAM core in accordance with at least one embodiment of the present disclosure.
FIG. 7B is a circuit diagram of another WAS circuit, in accordance with at least one embodiment of the present disclosure.

FIG. 7A is a block diagram of an SRAM core 700A in accordance with at least one embodiment of the present disclosure. Relative to FIG. 2A, FIG. 7A shows SRAM core 700A as an alternative to SRAM core 200. For the sake of brevity, similarities between SRAM core 700A and SRAM core 200 will not be discussed. Rather, the discussion will focus on at least some of the differences between SRAM core 700A and SRAM core 200.

Differences between SRAM core 700A and SRAM core 200 include at least the following. SRAM core 700A includes: WAS circuits 712A-712D (see discussion below of FIG. 7B); an input/out interface 742; and cell-edge units 740A-740D. In some embodiments, PL array 706 and I/O unit 742 are combined as one unit. Cell-edge units 740A-740D define the boundary of the bit-cell array.

FIG. 7B is a circuit diagram of WAS circuit 712B, in accordance with at least one embodiment of the present disclosure. Relative to FIG. 2B, FIG. 7A shows WAS circuit 712B as an alternative to WAS circuit 212B. For the sake of brevity, similarities between WAS circuit 712B and WAS circuit 212B will not be discussed. Rather, the discussion will focus on at least some of the differences between WAS circuit 712B and WAS circuit 212B.

Differences between WAS circuit 712B and WAS circuit 212B include at least the following. Whereas the gate electrodes of transistors NC2 and N1D of WAS circuit 212B are connected to the latch-enable signal line, the gate electrodes of transistors N4C and N3D of WAS circuit 712B are connected to the latch-enable signal line. Also, whereas transistors N4C and N3D of sub-circuit 720D have the always-OFF configuration, transistor N2C of sub-circuit 720C and transistor N1D of sub-circuit 720D have the always-ON configuration for NMOS transistors wherein the gate electrode of each of transistors N2C and N1D is connected to voltage VDD.

Figures 7C, 7D:
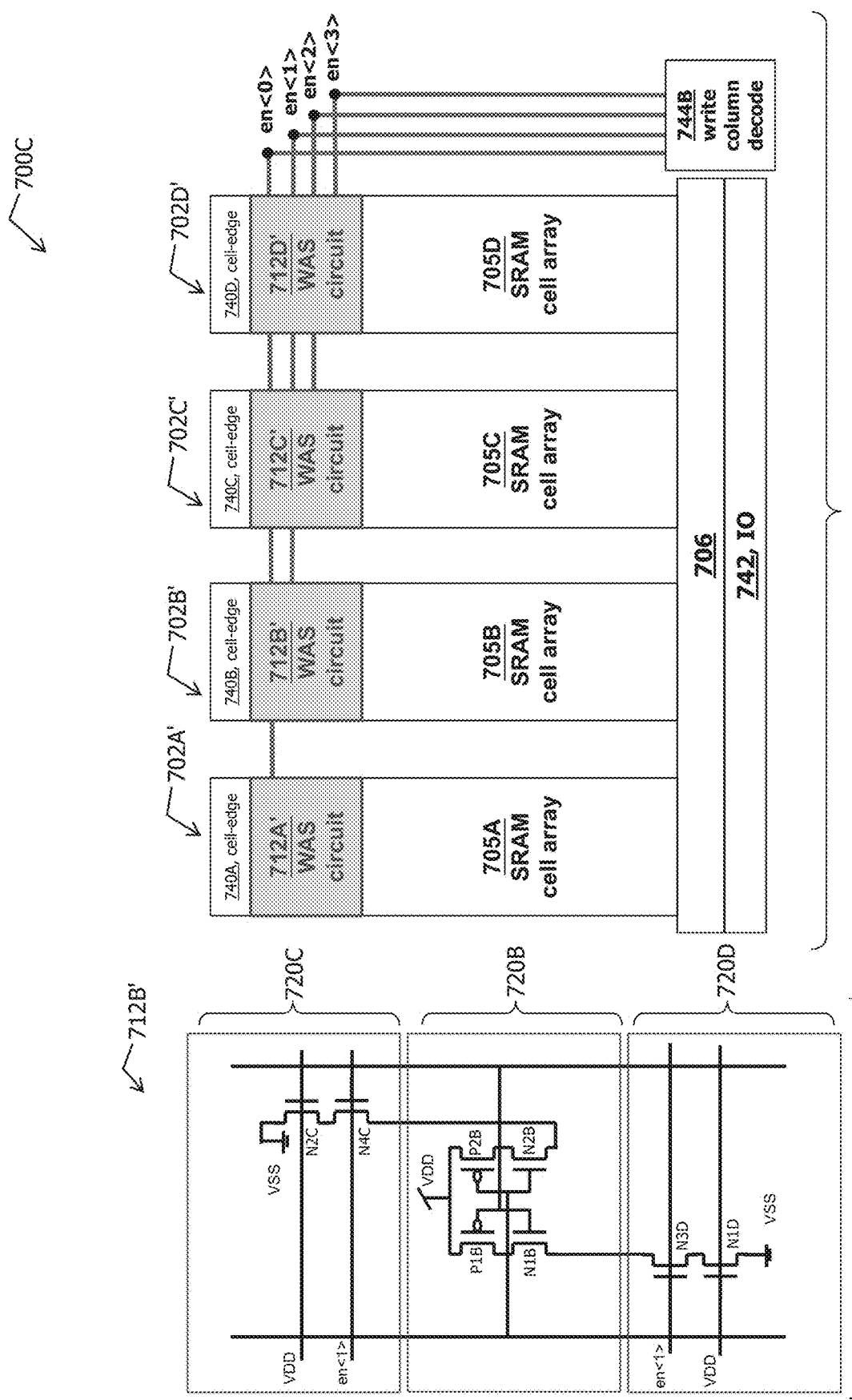
FIG. 7C is a block diagram of another SRAM core in accordance with at least one embodiment of the present disclosure.
FIG. 7D is a circuit diagram of another WAS circuit, in accordance with at least one embodiment of the present disclosure.

FIG. 7C is a block diagram of an SRAM core 700C in accordance with at least one embodiment of the present disclosure. Relative to FIG. 7A, FIG. 7C shows SRAM core 700C as an alternative to SRAM core 700A. For the sake of brevity, similarities between SRAM core 700C and SRAM core 700A will not be discussed. Rather, the discussion will focus on at least some of the differences between SRAM core 700C and SRAM core 700A.

Differences between SRAM core 700A and SRAM core 700C include at least the following. SRAM core 700C includes: a write column decode unit 744B; and WAS circuits 712A'-712D' (see discussion below of FIG. 7D). Write column decode unit 744B generates column-selective, latch-enable signals en<0>-en<3> for corresponding columns 702A'-702D'. Accordingly, enable signals en<0>-en<3> are provided to corresponding WAS circuits 712A'-712D'. Relative to SRAM core 700A of FIG. 7A, an advantage of SRAM core 700C of FIG. 7C is that each of WAS circuits 712A-712D' can be independently enabled/disabled by corresponding enable signals en<0>-en<3>.

FIG. 7D is a circuit diagram of WAS circuit 712B', in accordance with at least one embodiment of the present disclosure. Relative to FIG. 7B, FIG. 7D shows WAS circuit 712B' as an alternative to WAS circuit 712B. For the sake of brevity, similarities between WAS circuit 712B' and WAS circuit 712B will not be discussed. Rather, the discussion will focus on at least some of the differences between WAS circuit 712B' and WAS circuit 712B.

Differences between WAS circuit 712B' and WAS circuit 712B include at least the following. In WAS circuit 712B', the gate electrode of each of transistors N4C and N3D is connected to corresponding latch-enable signal en<1>. Relative to WAS circuit 712B of FIG. 7B, an advantage of WAS circuit 712B' SRAM core 700D is that WAS circuit 712B' is enabled/disabled by corresponding enable signal en<11> independently of how WAS circuits 712A' and 712C'-712D' are enabled/disabled by corresponding enable signals en<0> and en<2>-en<3>.

Figures 7E, 7F:
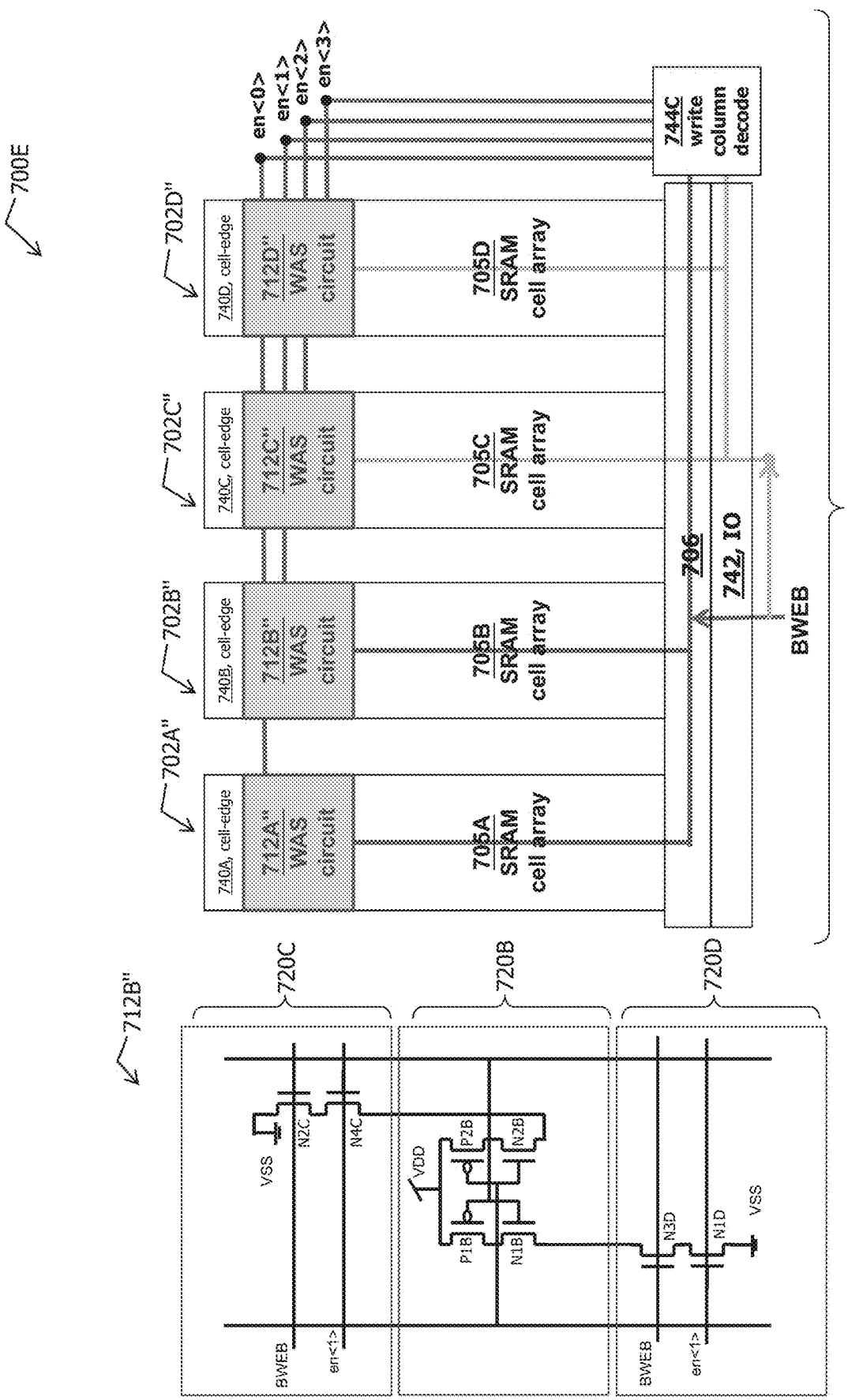
FIG. 7E is a block diagram of another SRAM core in accordance with at least one embodiment of the present disclosure.
FIG. 7F is a circuit diagram of another WAS circuit, in accordance with at least one embodiment of the present disclosure.

FIG. 7E is a block diagram of an SRAM core 700E in accordance with at least one embodiment of the present disclosure. Relative to FIG. 7C, FIG. 7E shows SRAM core 700E as an alternative to SRAM core 700C. For the sake of brevity, similarities between SRAM core 700E and SRAM core 700C will not be discussed. Rather, the discussion will focus on at least some of the differences between SRAM core 700E and SRAM core 700C.

Differences between SRAM core 700E and SRAM core 700C include at least the following. SRAM core 700E includes: a bit-write-enable_bar BWEB signal; and WAS circuits 712A"-712D" (see discussion below of FIG. 7F). The BWEB signal is provided to write column decode unit 744C and to each of WAS circuits 712A"-712D".

FIG. 7F is a circuit diagram of WAS circuit 712B", in accordance with at least one embodiment of the present disclosure. Relative to FIG. 7D, FIG. 7F shows WAS circuit 712B" as an alternative to WAS circuit 712B'. For the sake of brevity, similarities between WAS circuit 712B" and WAS circuit 712B' will not be discussed. Rather, the discussion will focus on at least some of the differences between WAS circuit 712B" and WAS circuit 712B'.

Differences between WAS circuit 712B" and WAS circuit 712B' include at least the following. In WAS circuit 712B", the gate electrode of each of transistors N2C and N1D is connected to the BWEB signal.

Figures 7G, 7H:
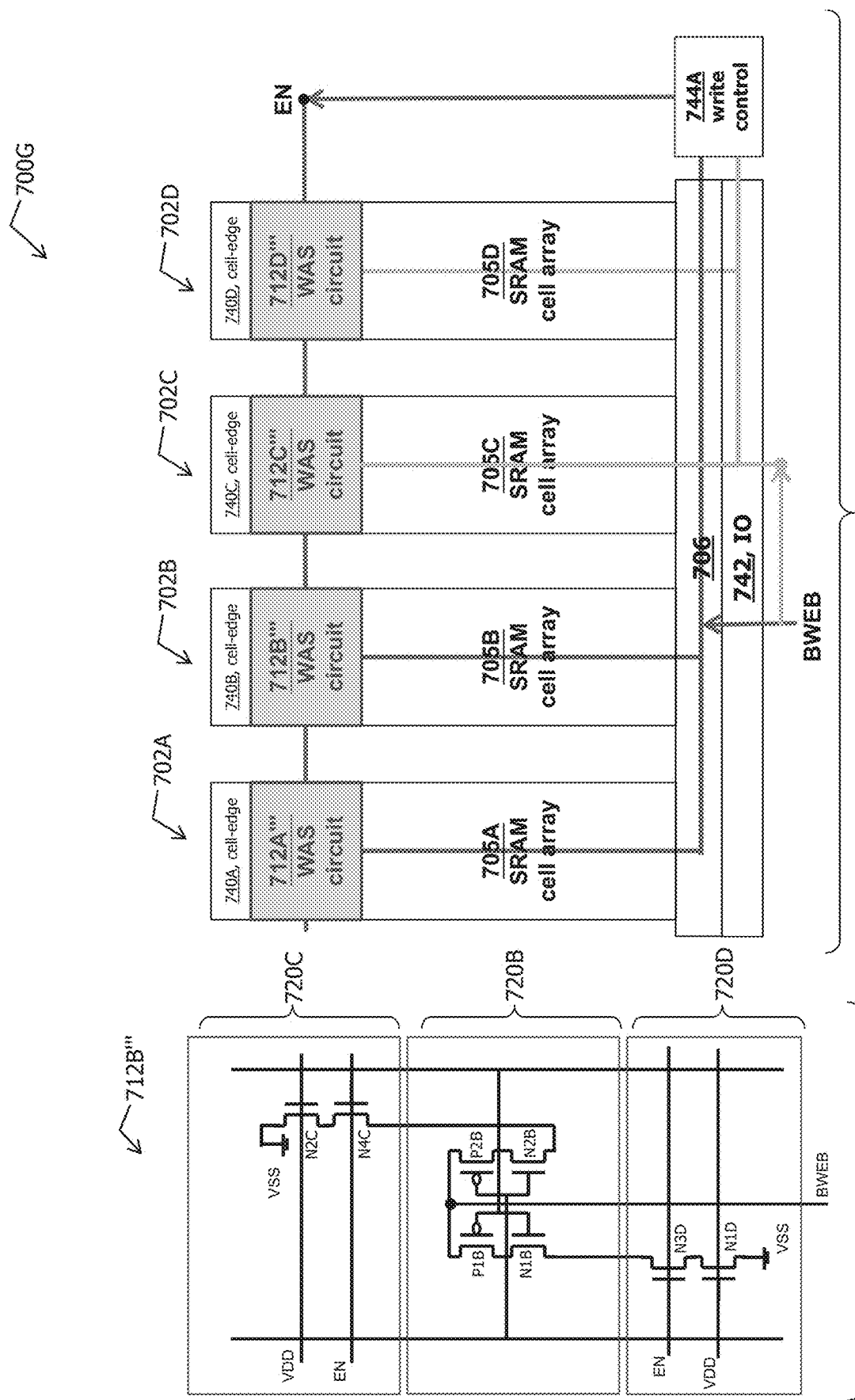
FIG. 7G is a block diagram of another SRAM core in accordance with at least one embodiment of the present disclosure.
FIG. 7H is a circuit diagram of another WAS circuit, in accordance with at least one embodiment of the present disclosure.

FIG. 7G is a block diagram of an SRAM core 700G in accordance with at least one embodiment of the present disclosure. Relative to FIG. 7E, FIG. 7G shows SRAM core 700G as an alternative to SRAM core 700E. For the sake of brevity, similarities between SRAM core 700G and SRAM core 700E will not be discussed. Rather, the discussion will focus on at least some of the differences between SRAM core 700G and SRAM core 700E.

Differences between SRAM core 700G and SRAM core 700E include at least the following. SRAM core 700G includes: WAS circuits 712A'''-712D''' (see discussion below of FIG. 7H); and write control unit 744A of SRAM core 700A of FIG. 7A rather than write column decode unit 744C of SRAM core 700E of FIG. 7E.

FIG. 7H is a circuit diagram of WAS circuit 712B''', in accordance with at least one embodiment of the present disclosure. Relative to FIG. 7F, FIG. 7H shows WAS circuit 712B''' as an alternative to WAS circuit 712B''. For the sake of brevity, similarities between WAS circuit 712B''' and WAS circuit 712B'' will not be discussed. Rather, the discussion will focus on at least some of the differences between WAS circuit 712B''' and WAS circuit 712B''.

Differences between WAS circuit 712B''' and WAS circuit 712B'' include at least the following. In WAS circuit 712B''', the gate electrode of each of transistors N2C and N1D is connected to voltage VDD. Also, in WAS circuit 712B'', the source electrodes of transistors P1B and P2B are connected to the signal BWEB rather than to voltage VDD (as in WAS circuit 712B'').

Figure 8A:
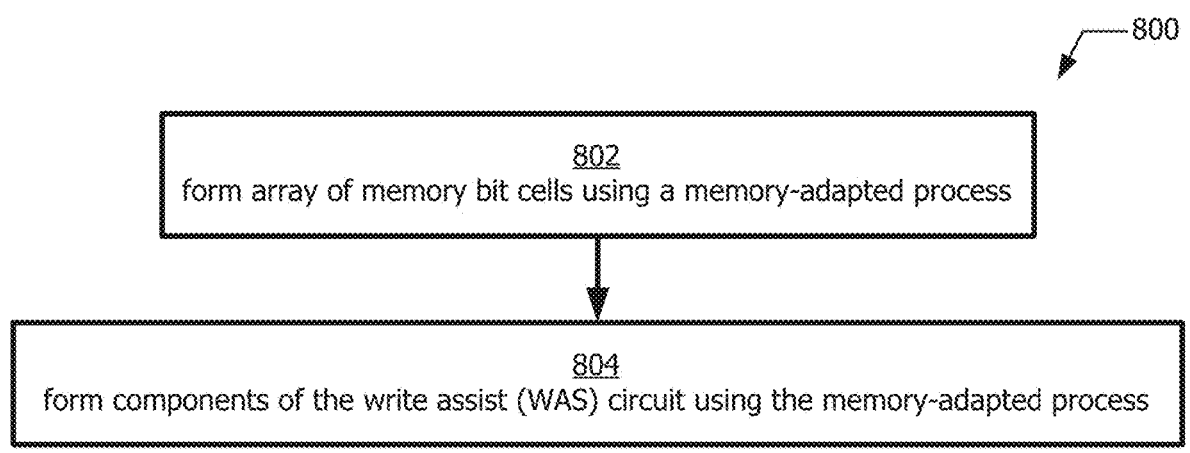
FIG. 8A is a flowchart of a method of forming a WAS circuit, in accordance with some embodiments.

FIG. 8A is a flowchart of a method 800 of forming a WAS circuit, in accordance with some embodiments. Examples of WAS circuits formed by method 800 include one or more of WAS circuit 212B of FIG. 2B, 312B of FIG. 3, 412B of FIG. 4A, 712B of FIG. 7B, 712B' of FIG. 7D, 712B'' of FIG. 7F, 712B''' of FIG. 7H, or the like.

In FIG. 8A, the flowchart of method 800 includes blocks 802-810. At block 802, an array of memory cells, e.g., bit cells such as SRAM bit cells, is formed using a memory-adapted process. From block 802, flow proceeds to block 804. At block 804, components of the WAS circuit are formed using the memory-adapted process.

Figure 8B:
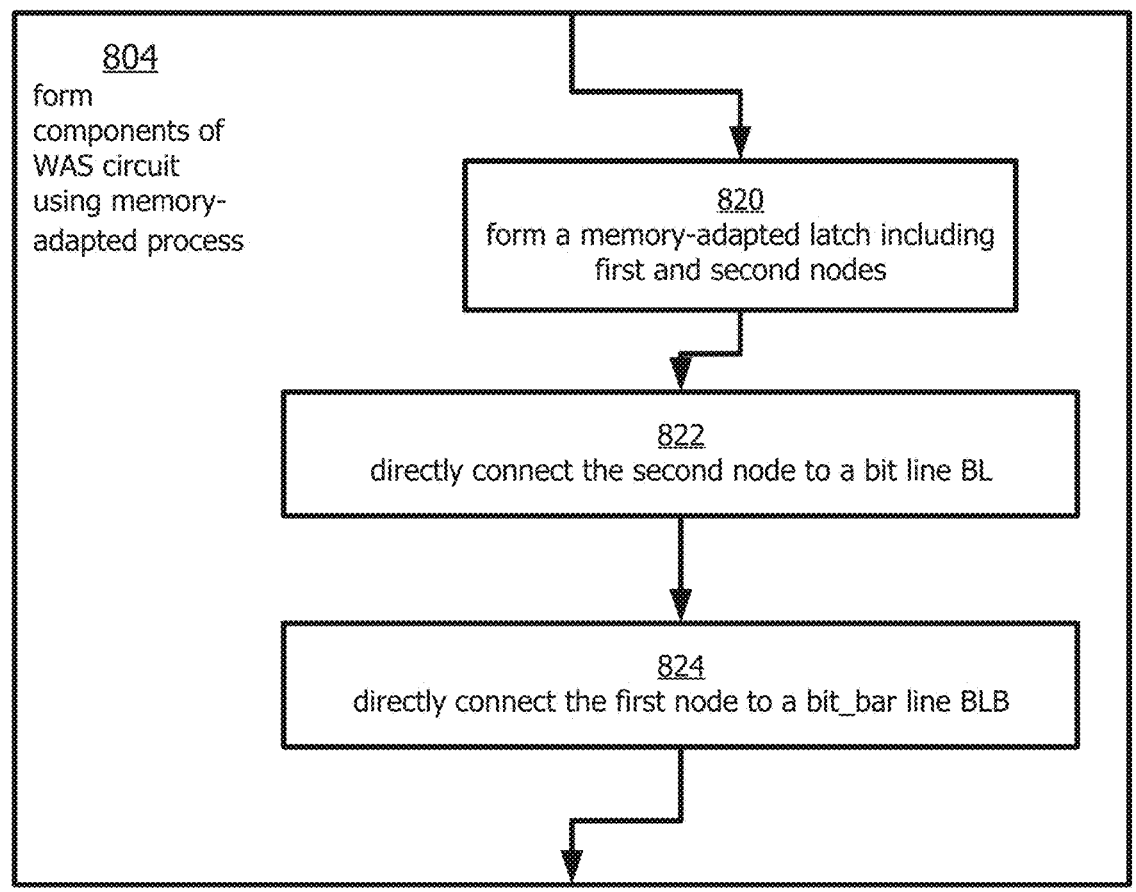
FIG. 8B is a flowchart showing a block of FIG. 8A in more detail, in accordance with some embodiments.

FIG. 8B is a flowchart showing block 804 of FIG. 8A in more detail, in accordance with some embodiments.

In FIG. 8B, block 804 (again, which forms components of the WAS circuit using a memory-adapted process) includes blocks 820-824. At block 820, a latch is formed which includes first and second nodes. An example of the latch is latch 218B of FIG. 2B. Accordingly, an example of the first node of the latch is segment 230B of FIG. 2B, and an example of the second node of the latch is segment 232B of FIG. 2B. From block 820, flow proceeds to block 822.

At block 822, the second node is directly connected to a bit line BL. An example of such a direct connection to the bit line BL are series-connected segments 224A'-224A'' of FIG. 2B. From block 822, flow proceeds to block 824. At block 824, the first node is directly connected to a bit_bar line BLB. An example of such a direct connection to the bit_bar line are series-connected segments 225A'-225A'' of FIG. 2B.

Figure 8C:
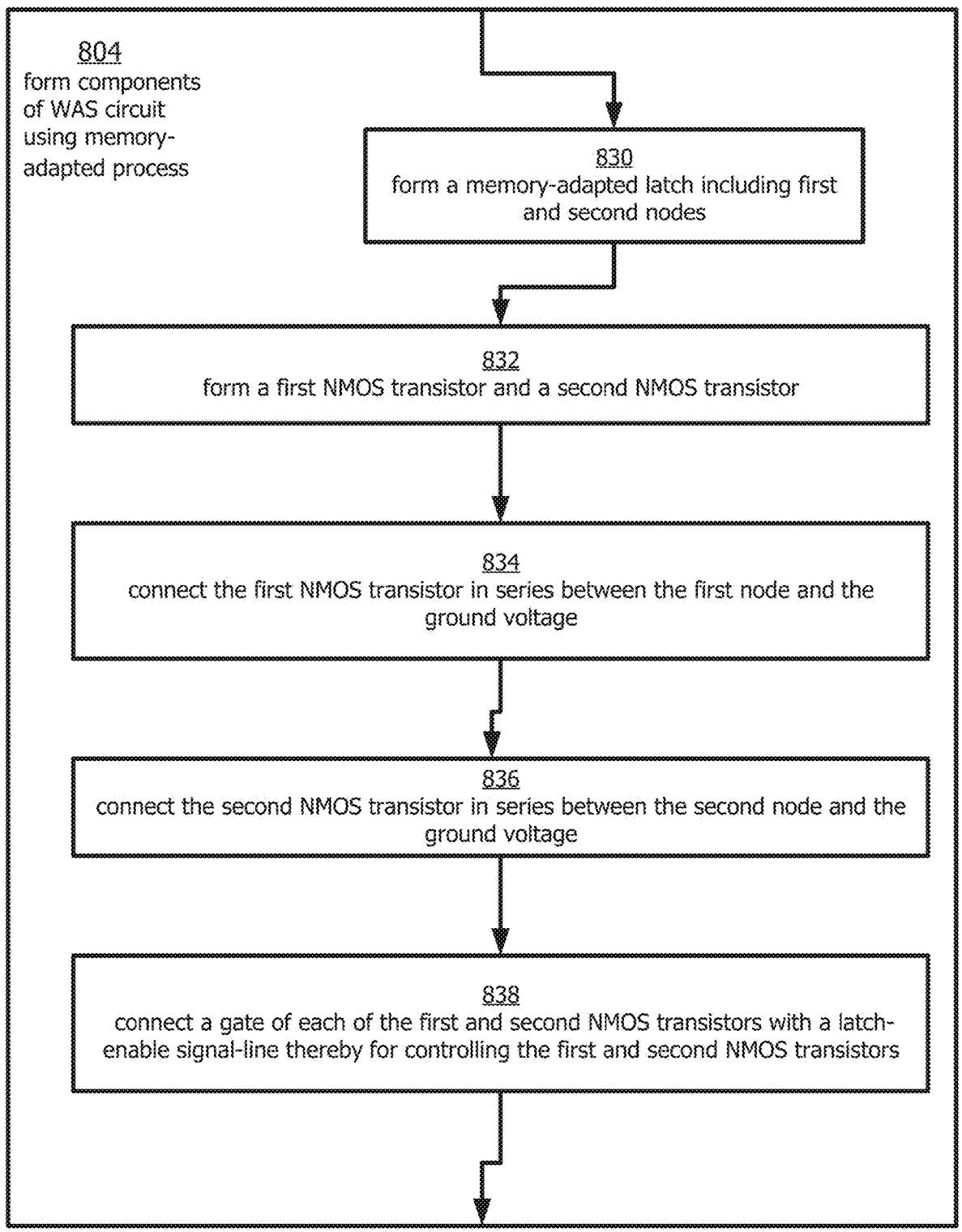
FIG. 8C is a flowchart showing a block of FIG. 8A in more detail, in accordance with some embodiments.

FIG. 8C is a flowchart showing block 804 of FIG. 8A in more detail, in accordance with some embodiments.

In FIG. 8C, block 804 (again, which forms components of the WAS circuit using a memory-adapted process) includes blocks 830-838. At block 830, a latch is formed which includes first and second nodes. An example of the latch is latch 218B of FIG. 2B. Accordingly, an example of the first node of the latch is segment 226A of FIG. 2B, and an example of the second node of the latch is segment 226B of FIG. 2B. From block 830, flow proceeds to block 832.

At block 832, a first NMOS transistor and a second NMOS transistor are formed. An example of the first NMOS transistor is transistor N3D of sub-circuit 220D of FIG. 2B. An example of the second NMOS transistor is transistor N2C of sub-circuit 220C of FIG. 2B. From block 832, flow proceeds to block 834. At block 834, the first NMOS transistor is connected in series between the first node and the ground voltage. Continuing the example begun above, transistor N3D is connected in series between segment 226A and the ground voltage. From block 834, flow proceeds to block 836. At block 836, the second transistor is connected in series between the second node and the ground voltage. Continuing the example begun above, transistor N2C is connected in series between segment 226B and the ground voltage. From block 836, flow proceed to block 838. At block 838, a gate electrode of each of the first and second transistors is connected with a latch-enable signal line. The signal on the latch-enable signal line is used to control the first and second transistors. Continuing the examples begun above, segments 269D and 361C are added which connect the gate electrodes of corresponding transistors N1D and N2C with a latch-enable signal line (not shown in FIG. 2B).

Figure 8D:
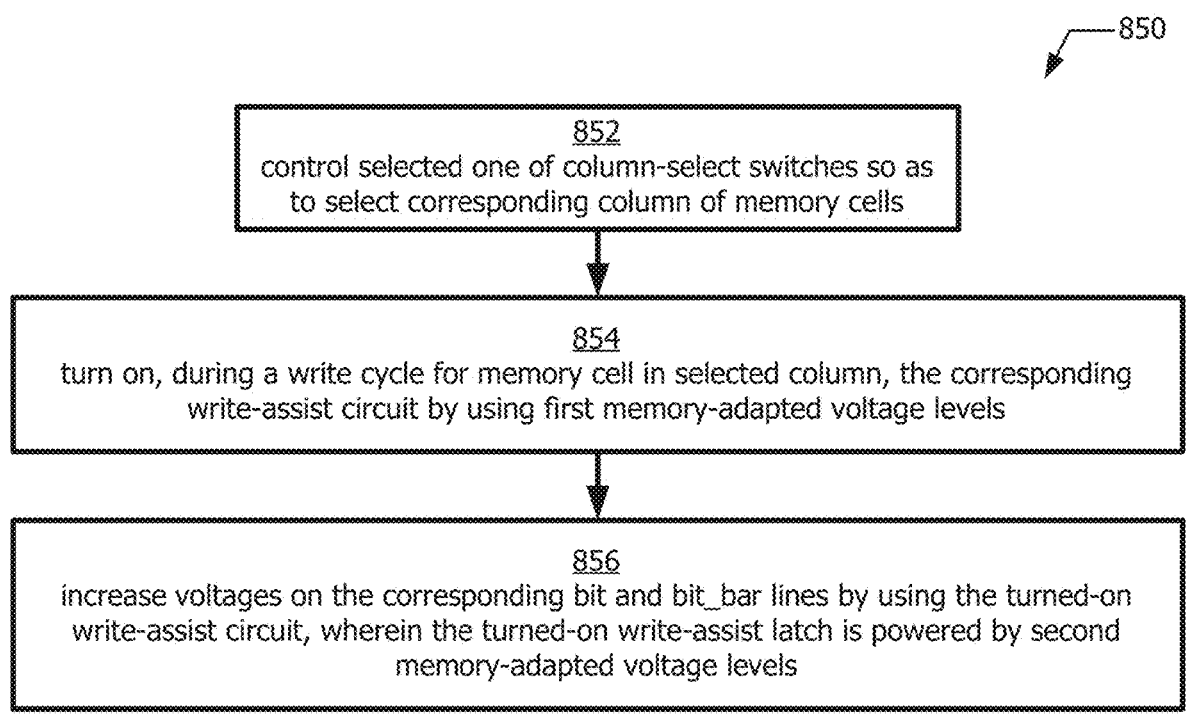
FIG. 8D is a flowchart of a method of operating a memory system, in accordance with some embodiments.

FIG. 8D is a flowchart of a method 850 of operating a memory circuit which includes a WAS circuit, in accordance with some embodiments.

An example of the memory circuit controlled by method 850 is memory macro 101 of FIG. 1. Examples of WAS circuits included in the memory circuit controlled by method 850 include one or more of WAS circuit 212B of FIG. 2B, 312B of FIG. 3, 412B of FIG. 4A, 712B of FIG. 7B, 712B' of FIG. 7D, 712B'' of FIG. 7F, 712B''' of FIG. 7H, or the like.

In FIG. 8A, the flowchart of method 850 includes blocks 852-856. At block 852, a selected one of the column-selection switches is controlled to select a corresponding one of the columns in an array of memory cells. An example of the column-selection switch is column-selection switch 245. From block 852, flow proceeds to block 854. At block 854, during a write cycle of a memory cell in the selected column, a corresponding WAS circuit is turned on using first memory-adapted voltage levels which are appropriate to the memory-adapted transistors in the WAS circuit. An example of the corresponding WAS circuit is WAS circuit 212B. In some embodiments, the first memory-adapted voltage levels are derived from voltages available in the memory power-domain. From block 854, flow proceeds to block 856.

At block 856, voltages on the corresponding bit line (e.g., BL) and bit_bar line (e.g., BL_bar) line are increased by using the turned-on WAS circuit. The turned-on WAS circuit is powered by second memory-adapted voltage levels which are appropriate to the memory-adapted transistors in the WAS circuit. In some embodiments, the second memory-adapted voltage levels are derived from voltages available in the memory power-domain. In some embodiments, the voltages are increased so that amplitudes of voltages at terminating/distal ends of the bit line and bit_bar line are raised to be approximately the same, or greater, than amplitudes of voltages on the corresponding starting/proximal ends of the bit-line and the bit_bar line.

Figure 9:
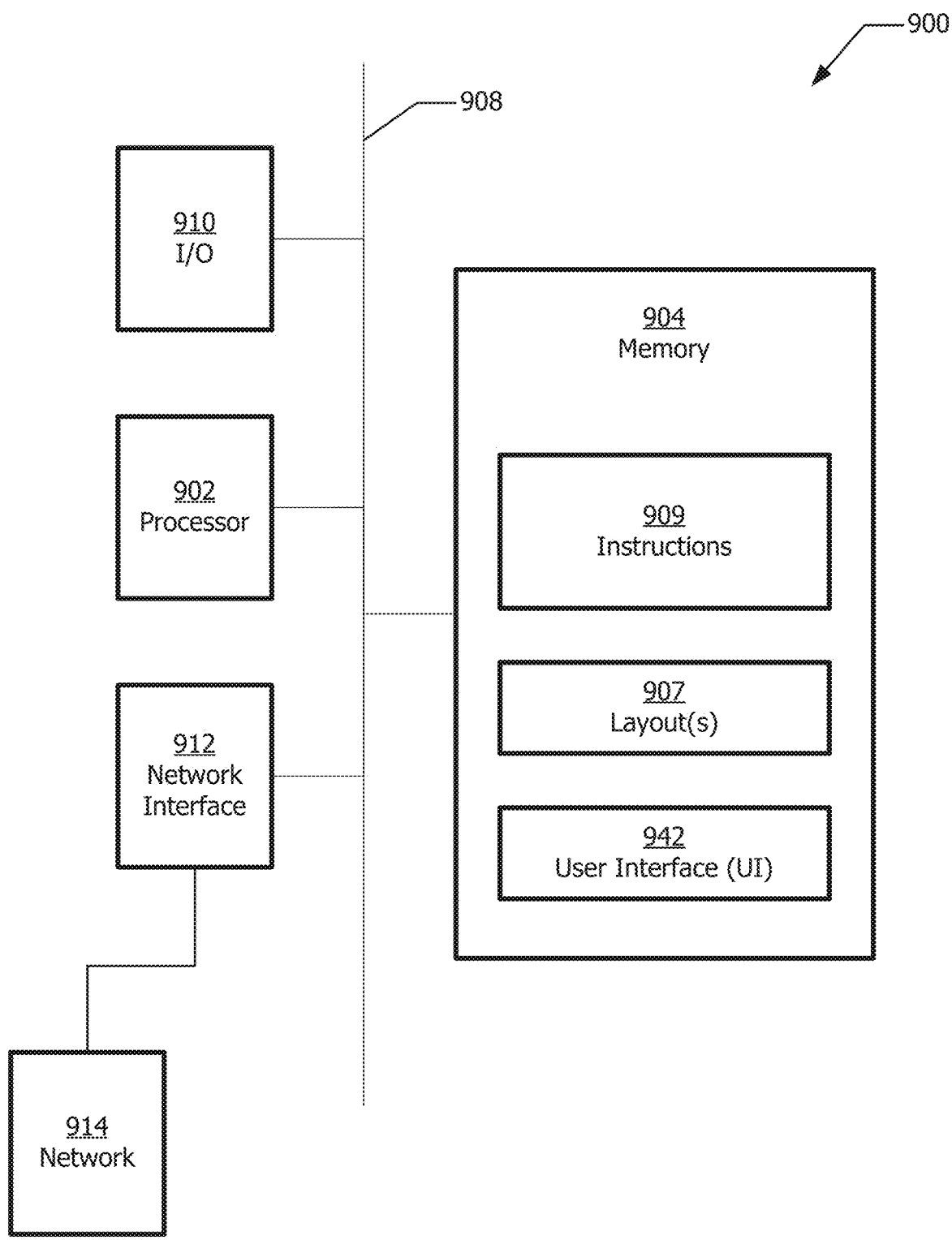
FIG. 9 is a block diagram of an electronic design automation (EDA) system, in accordance with at least one embodiment of the present disclosure.

FIG. 9 is a block diagram of an electronic design automation (EDA) system 900, in accordance with at least one embodiment of the present disclosure.

In some embodiments, EDA system 900 includes an APR system. The method of flowcharts of FIGS. 8A-8C are implemented, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of, e.g., the methods of FIGS. 8A-8C, in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. Computer-readable storage medium 904 also includes one or more layouts 907 generated according to a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores a library (not shown) of standard cells.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

Again, EDA system 900 includes network interface 912. Network interface 912 includes wireless network interfaces such as BLUETOOTH, WIFI, WIMAX, GPRS, WCDMA, or the like; or wired network interfaces such as ETHERNET, USB, or the like. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
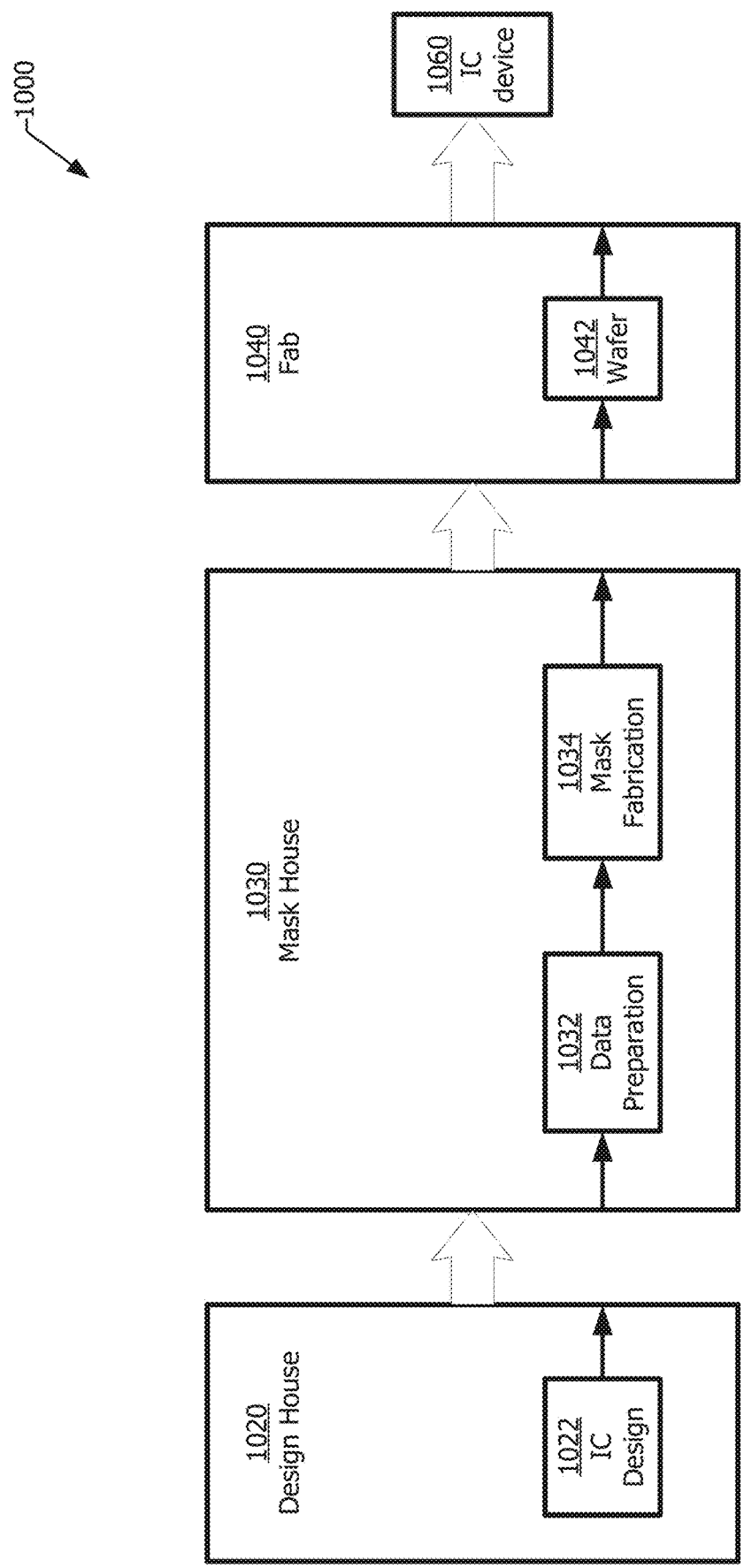
FIG. 10 is a block diagram of an integrated circuit (IC) manufacturing system, and an IC manufacturing flow associated therewith, in accordance with at least one embodiment of the present disclosure.

FIG. 10 is a block diagram of an integrated circuit (IC) manufacturing system 1000, and an IC manufacturing flow associated therewith, in accordance with at least one embodiment of the present disclosure.

In FIG. 10, IC manufacturing system 1000 includes entities, such as a design house 1020, a mask house 1030, and an IC manufacturer/fabricator ("fab") 1040, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1040 is owned by a single larger company. In some embodiments, two or more of design house 1020, mask house 1030, and IC fab 1040 coexist in a common facility and use common resources.

Design house (or design team) 1020 generates an IC design layout 1022. IC design layout 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout 1022 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout 1022. The design procedure includes one or more of logic design, physical design or place and route. IC design layout 1022 is presented in one or more data files having information of the geometrical patterns. For example, IC design layout 1022 can be expressed in a GDSII file format or DFII file format.

Mask house 1030 includes data preparation 1052 and mask fabrication 1034. Mask house 1030 uses IC design layout 1022 to manufacture one or more masks to be used for fabricating the various layers of IC device 1060 according to IC design layout 1022. Mask house 1030 performs mask data preparation 1052, where IC design layout 1022 is translated into a representative data file ("RDF"). Mask data preparation 1052 provides the RDF to mask fabrication 1034. Mask fabrication 1034 includes a mask writer. A mask writer converts the RDF to an image on a substrate, such as a mask (reticle) or a semiconductor wafer. The design layout is manipulated by mask data preparation 1052 to comply with particular characteristics of the mask writer and/or requirements of IC fab 1040. In FIG. 10, mask data preparation 1052 and mask fabrication 1034 are illustrated as separate elements. In some embodiments, mask data preparation 1052 and mask fabrication 1034 can be collectively referred to as mask data preparation.

In some embodiments, mask data preparation 1052 includes optical proximity correction (OPC) which uses lithography enhancement techniques to compensate for image errors, such as those that can arise from diffraction, interference, other process effects and the like. OPC adjusts IC design layout 1022. In some embodiments, mask data preparation 1052 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1052 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1034, which may undo part of the modifications performed by OPC in order to meet mask creation rules.

In some embodiments, mask data preparation 1052 includes lithography process checking (LPC) that simulates processing that will be implemented by IC fab 1040 to fabricate IC device 1060. LPC simulates this processing based on IC design layout 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1022.

It should be understood that the above description of mask data preparation 1052 has been simplified for the purposes of clarity. In some embodiments, data preparation 1052 includes additional features such as a logic operation (LOP) to modify the IC design layout according to manufacturing rules. Additionally, the processes applied to IC design layout 1022 during data preparation 1052 may be executed in a variety of different orders.

After mask data preparation 1052 and during mask fabrication 1034, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 1034 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1040 is an IC fabrication business that includes one or more manufacturing facilities for the fabrication of a variety of different IC products. In some embodiments, IC Fab 1040 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1040 uses the mask (or masks) fabricated by mask house 1030 to fabricate IC device 1060. Thus, IC fab 1040 at least indirectly uses IC design layout 1022 to fabricate IC device 1060. In some embodiments, a semiconductor wafer 1052 is fabricated by IC fab 1040 using the mask (or masks) to form IC device 1060. Semiconductor wafer 1052 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In an embodiment, a write assist circuit includes: a first PMOS transistor and a first NMOS transistor connected in series between a power-supply voltage and a first node, gate electrodes of the first PMOS transistor and the first NMOS transistor being connected to a second node; a first switchable conductive path between the first node and a ground voltage; a second PMOS transistor and a second NMOS transistor connected in series between the power-supply voltage and a third node, gate electrodes of the second PMOS transistor and the second NMOS transistor being connected to a fourth node; a second switchable conductive path between the third node and the ground voltage; a third NMOS transistor connected in series between the fourth node and a data line; a first shunt connecting the fourth node and the data line; a fourth NMOS transistor connected in series between the second node and a data_bar line; and a second shunt connecting the second node and the data_bar line.

In an embodiment, a write assist circuit includes: a first PMOS transistor and a first NMOS transistor connected in series between a power-supply voltage and a first node, gate electrodes of the first PMOS transistor and the first NMOS transistor being connected to a second node, the second node being connected to a data_bar line; a first switchable conductive path between the first node and a ground voltage; a second PMOS transistor and a second NMOS transistor connected in series between the power-supply voltage and a third node, gate electrodes of the second PMOS transistor and the second NMOS transistor being connected to a fourth node, the fourth node being connected to a data line; a second switchable conductive path between the third node and the ground voltage; a third NMOS transistor having a high resistance configuration and for which a first drain/source electrode is connected to the fourth node; a first shunt connecting the fourth node and the data line; a fourth NMOS transistor having a high resistance configuration and for which a first drain/source electrode is connected to the second node; and a second shunt connecting the second node and the data_bar line.

In an embodiment, a write assist circuit includes: a memory-adapted latch and memory-adapted third and fourth NMOS transistors. The latch includes: a memory-adapted first PMOS transistor and a memory-adapted first NMOS transistor connected in series between a power-supply voltage and a first node, the first node being selectively connectable to a ground voltage; and a memory-adapted second PMOS transistor and a memory-adapted second NMOS transistor connected in series between the power-supply voltage and the second node, the second node being selectively connectable to the ground voltage. The third NMOS transistor is connected in series between the first node and the ground voltage; and the fourth NMOS transistor connected in series between the second node and the ground voltage. A gate electrode of each of the third and fourth transistors is connected to a latch-enable signal-line thereby for controlling the memory-adapted latch.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A write assist circuit comprising:
   a first PMOS transistor and a first NMOS transistor connected in series between a power-supply voltage and a first node, gate electrodes of the first PMOS transistor and the first NMOS transistor being connected to a second node;
   a first switchable conductive path between the first node and a ground voltage;
   a second PMOS transistor and a second NMOS transistor connected in series between the power-supply voltage and a third node, gate electrodes of the second PMOS transistor and the second NMOS transistor being connected to a fourth node;
   a second switchable conductive path between the third node and the ground voltage;
   a third NMOS transistor connected in series between the fourth node and a data line;
   a first shunt connecting the fourth node and the data line;
   a fourth NMOS transistor connected in series between the second node and a data_bar line; and
   a second shunt connecting the second node and the data_bar line.

2. The write assist circuit of claim 1, wherein the first switchable conductive path includes:
   a fifth NMOS transistor connected in series between the first node and the ground voltage; and
   wherein a gate electrode of the fifth NMOS transistor is configured to receive a control signal.

3. The write assist circuit of claim 2, wherein the second switchable conductive path includes:
   a sixth NMOS transistor connected in series between the third node and the ground voltage; and
   wherein a gate electrode of the sixth NMOS transistor is configured to receive the control signal.

4. The write assist circuit of claim 1, wherein:
   the first shunt lacks a transistor; and
   the second shunt lacks a transistor.

5. The write assist circuit of claim 4, wherein:
   a gate electrode of the third NMOS transistor is connected to the first shunt; and
   a gate electrode of the fourth NMOS transistor is connected to the second shunt.

6. The write assist circuit of claim 1, further comprising:
   a fifth NMOS transistor connected in series between the first node and the ground voltage;
   a sixth NMOS transistor connected in series between the third node and the ground voltage; and
   wherein gate electrodes of each of the fifth NMOS transistor and the sixth NMOS transistor are connected to the ground voltage.

7. The write assist circuit of claim 1, wherein:
   the data line is a bit line; and
   the data_bar line is a bit_bar line.

8. A write assist circuit comprising:
   a first PMOS transistor and a first NMOS transistor connected in series between a power-supply voltage and a first node, gate electrodes of the first PMOS transistor and the first NMOS transistor being connected to a second node, the second node being connected to a data_bar line;
   a first switchable conductive path between the first node and a ground voltage;
   a second PMOS transistor and a second NMOS transistor connected in series between the power-supply voltage and a third node, gate electrodes of the second PMOS transistor and the second NMOS transistor being connected to a fourth node, the fourth node being connected to a data line;
a second switchable conductive path between the third node and the ground voltage;
a third NMOS transistor having a high resistance configuration and for which a first drain/source electrode is connected to the fourth node;
a first shunt connecting the fourth node and the data line;
a fourth NMOS transistor having a high resistance configuration and for which a first drain/source electrode is connected to the second node; and
a second shunt connecting the second node and the data_bar line.

9. The write assist circuit of claim 8, wherein the first switchable conductive path includes:
a fifth NMOS transistor connected in series between the first node and a fifth node;
a sixth NMOS transistor connected in series between the fifth node and the ground voltage; and
wherein a gate electrode of the fifth NMOS transistor is configured to receive a control signal.

10. The write assist circuit of claim 9, wherein the first switchable conductive path includes:
a gate electrode of the sixth NMOS transistor is connected to the power-supply voltage.

11. The write assist circuit of claim 9, wherein the second switchable conductive path includes:
a seventh NMOS transistor connected in series between the third node and a sixth node; and
an eighth NMOS transistor connected in series between the sixth node and the ground voltage; and
wherein a gate electrode of the seventh NMOS transistor is configured to receive the control signal.

12. The write assist circuit of claim 11, wherein the first switchable conductive path includes:
a gate electrode of the eighth NMOS transistor is connected to the power-supply voltage.

13. The write assist circuit of claim 11, further comprising:
a third PMOS transistor connected in series between the power-supply voltage and the gate electrode of the eighth NMOS transistor; and
wherein a gate electrode of the third PMOS transistor is configured to receive the control signal.

14. The write assist circuit of claim 9, further comprising:
a third PMOS transistor connected in series between the power-supply voltage and the gate electrode of the sixth NMOS transistor; and
wherein a gate electrode of the third PMOS transistor is configured to receive the control signal.

15. The write assist circuit of claim 8, wherein:
the first shunt lacks a transistor; and
the second shunt lacks a transistor.

16. The write assist circuit of claim 8, wherein:
a gate electrode of each of the third NMOS transistor and the fourth NMOS transistor is connected to the ground voltage.

17. The write assist circuit of claim 8, further comprising:
a fifth NMOS transistor connected in series between the first node and a fifth node;
a sixth NMOS transistor connected in series between the fifth node and the ground voltage;
a seventh NMOS transistor connected in series between the third node and a sixth node; and
an eighth NMOS transistor connected in series between the sixth node and the ground voltage; and
wherein gate electrodes of each of the fifth NMOS transistor and the eighth NMOS transistor are connected to the ground voltage.

18. The write assist circuit of claim 8, wherein:
a second drain/source electrode of the third NMOS transistor is connected to a fifth node;
a second drain/source electrode of the fourth NMOS transistor is connected to a sixth node; and
the write assist circuit further comprises:
a fifth NMOS transistor and a sixth NMOS transistor connected in series between the fifth node and the ground voltage; and
a seventh NMOS transistor and an eighth NMOS transistor connected in series between the sixth node and the ground voltage; and
wherein a gate electrode of each of the fifth NMOS transistor, the sixth NMOS transistor, the seventh NMOS transistor and the eighth NMOS transistor is connected to the ground voltage.

19. A write assist circuit comprising:
a memory-adapted latch including:
a memory-adapted first PMOS transistor and a memory-adapted first NMOS transistor connected in series between a power-supply voltage and a first node, the first node being selectively connectable to a ground voltage; and
a memory-adapted second PMOS transistor and a memory-adapted second NMOS transistor connected in series between the power-supply voltage and a second node, the second node being selectively connectable to the ground voltage;
a memory-adapted third NMOS transistor connected in series between the first node and the ground voltage; and
a memory-adapted fourth NMOS transistor connected in series between the second node and the ground voltage;
wherein a gate electrode of each of the memory-adapted third and fourth transistors is connected to a latch-enable signal-line thereby for controlling the memory-adapted latch;
wherein the memory-adapted first and second PMOS and the memory-adapted first and second NMOS transistors are adapted for at least one of a memory power-domain, higher threshold voltages, lower saturation currents or lower leakage currents; and
whereas logic-adapted transistors are adapted for at least one of a logic power-domain, lower threshold voltages, higher saturation currents or higher leakage currents.

20. The write assist circuit of claim 19, wherein:
gate electrodes of the memory-adapted first PMOS transistor and the memory-adapted first NMOS transistor are connected to a third node;
gate electrodes of the memory-adapted second PMOS transistor and the memory-adapted second NMOS transistor are connected to a fourth node;
the fourth node is connected to a data line; and
the third node is connected to data bar line.

* * * * *